US012648209B2

(12) United States Patent
Wirths et al.

(10) Patent No.: US 12,648,209 B2
(45) Date of Patent: Jun. 2, 2026

(54) POWER SEMICONDUCTOR DEVICE AND METHOD FOR MANUFACTURING A POWER SEMICONDUCTOR DEVICE

(71) Applicant: Hitachi Energy Ltd, Zürich (CH)

(72) Inventors: Stephan Wirths, Thalwil (CH); Lars Knoll, Hägglingen (CH); Andrei Mihaila, Rieden (CH)

(73) Assignee: HITACHI ENERGY LTD, Zürich (CH)

( * ) Notice: Subject to any disclaimer, the term of this patent is extended or adjusted under 35 U.S.C. 154(b) by 427 days.

(21) Appl. No.: 18/268,169

(22) PCT Filed: Dec. 20, 2021

(86) PCT No.: PCT/EP2021/086803
§ 371 (c)(1),
(2) Date: Jun. 16, 2023

(87) PCT Pub. No.: WO2022/136278
PCT Pub. Date: Jun. 30, 2022

(65) Prior Publication Data
US 2024/0055495 A1 Feb. 15, 2024

(30) Foreign Application Priority Data

Dec. 21, 2020 (EP) .................................... 20216022
Dec. 21, 2020 (EP) .................................... 20216094

(51) Int. Cl.
*H10D 64/23* (2025.01)
*H10D 12/01* (2025.01)
(Continued)

(52) U.S. Cl.
CPC ......... *H10D 64/258* (2025.01); *H10D 12/031* (2025.01); *H10D 30/43* (2025.01);
(Continued)

(58) Field of Classification Search
CPC .... H10D 64/258; H10D 12/031; H10D 30/43; H10D 30/6728; H10D 30/6729;
(Continued)

(56) References Cited

U.S. PATENT DOCUMENTS 5,308,445 A 5/1994 Takasu
5,323,040 A 6/1994 Baliga
(Continued)

FOREIGN PATENT DOCUMENTS

DE 10227831 A1 1/2004
EP 3264470 A1 1/2018
(Continued)

OTHER PUBLICATIONS

Harada et al., "First Demonstration of Dynamic Characteristics for SiC Superjunction MOSFET Realized using Multi-epitaxial Growth Method", 978-1-7281-1987-8/18/$31.00 © 2018 IEEE, pp. 8.2.1-8.2.4.

(Continued)

*Primary Examiner* — Mohammad A Rahman
(74) *Attorney, Agent, or Firm* — PROCOPIO, CORY, HARGREAVES & SAVITCH LLP

(57) ABSTRACT

Semiconductor device having first and second main electrodes with gate electrode layer inbetween, semiconductor layer stack between and in electrical contact with the first and second main electrodes having differently doped semiconductor layers. At least two semiconductor layers differ in their conductivity type and/or their doping concentration. Pillar-shaped or fin-shaped regions run through the gate electrode layer, each having a contact layer arranged at the first main electrode with a first doping concentration and a first conductivity type. Each contact layer extends to a side of the gate electrode layer facing the first main electrode, the contact layers of adjacent pillar-shaped or fin-shaped regions
(Continued)

Figure 1:
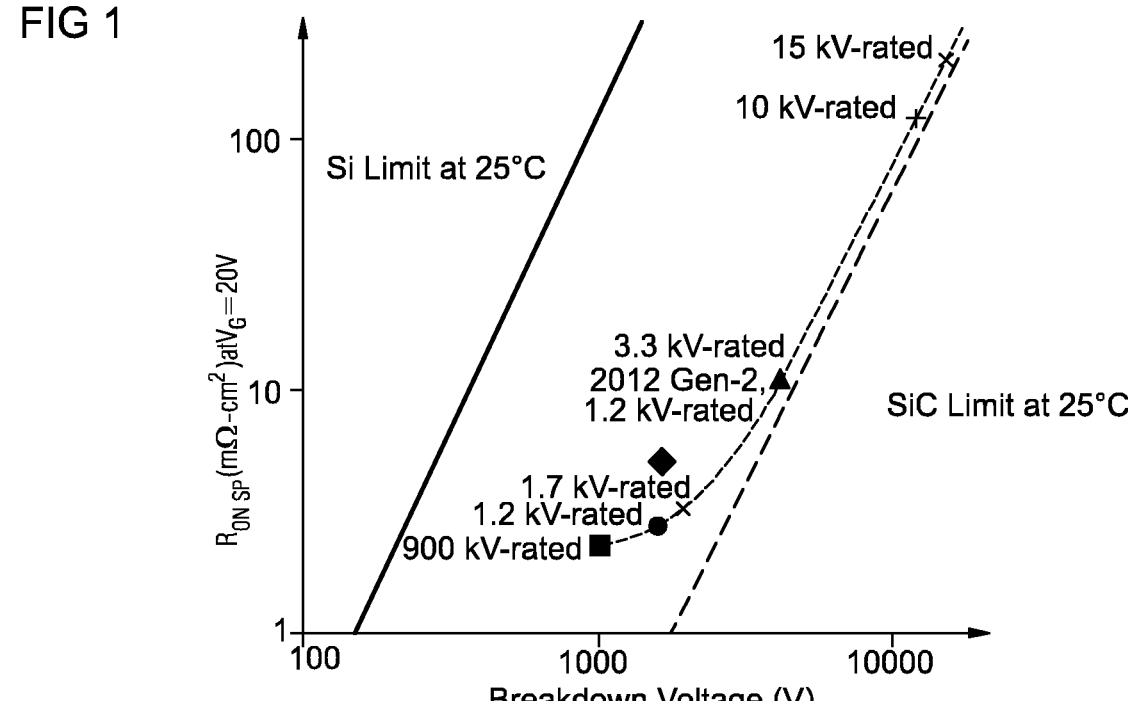

merge on the side of the gate electrode layer facing the first main electrode so that the contact layers of adjacent pillar-shaped or fin-shaped regions are arranged continuously on the side of the gate electrode layer facing the first main electrode.

13 Claims, 18 Drawing Sheets

(51) Int. Cl.

| | |
|---|---|
| *H10D 30/43* | (2025.01) |
| *H10D 30/67* | (2025.01) |
| *H10D 62/10* | (2025.01) |
| *H10D 62/40* | (2025.01) |
| *H10D 62/832* | (2025.01) |

(52) U.S. Cl.
CPC ..... *H10D 30/6728* (2025.01); *H10D 30/6729* (2025.01); *H10D 30/6735* (2025.01); *H10D 30/6757* (2025.01); *H10D 62/102* (2025.01); *H10D 62/122* (2025.01); *H10D 62/405* (2025.01); *H10D 62/8325* (2025.01); *H10D 64/252* (2025.01)

(58) Field of Classification Search
CPC ........... H10D 30/6735; H10D 30/6757; H10D 62/102; H10D 62/122; H10D 62/405; H10D 62/8325; H10D 64/252; H10D 30/025; H10D 30/0291; H10D 30/63; H10D 30/635; H10D 30/66; H10D 62/151; H10D 62/154; H10D 62/155; H10D 64/519
See application file for complete search history.

(56) References Cited

U.S. PATENT DOCUMENTS

| | | | |
|---|---|---|---|
| 5,994,735 A * | 11/1999 | Maeda ................. | H10B 12/395 |
| | | | 257/302 |
| 8,035,112 B1 | 10/2011 | Cooper | |
| 10,056,289 B1 | 8/2018 | Cheng et al. | |
| 2003/0186475 A1 | 10/2003 | Ueda et al. | |
| 2004/0144301 A1 | 7/2004 | Neudeck et al. | |
| 2007/0054467 A1 | 3/2007 | Currie et al. | |
| 2008/0233722 A1 | 9/2008 | Liao et al. | |
| 2011/0124169 A1 | 5/2011 | Ye et al. | |
| 2011/0140072 A1 | 6/2011 | Varangis et al. | |
| 2012/0119218 A1 | 5/2012 | Su | |
| 2016/0351391 A1 | 12/2016 | Borg et al. | |
| 2017/0077304 A1 | 3/2017 | Obradovic et al. | |
| 2018/0212040 A1 | 7/2018 | Bao et al. | |
| 2018/0350977 A1 | 12/2018 | Knoll et al. | |
| 2019/0371889 A1 | 12/2019 | Narita | |
| 2020/0111917 A1 | 4/2020 | Ramaswamy et al. | |

FOREIGN PATENT DOCUMENTS

| | | | |
|---|---|---|---|
| JP | 2009-081389 A | 4/2009 | |
| JP | 2013-065724 A | 4/2013 | |
| JP | 2015-156489 A | 8/2015 | |
| JP | 2019-212718 A | 12/2019 | |
| WO | 01/11690 A1 | 2/2001 | |
| WO | 2020/114666 A1 | 6/2020 | |

OTHER PUBLICATIONS

Yonezawa et al., "Progress in High and Ultrahigh Voltage Silicon Carbide Device Technology", 978-1-7281-1987-8/18/$31.00 © 2018 IEEE, pp. 19.3.1-19.3.4, IEDM18-447.
Udrea et al., "Superjunction Power Devices, History, Development, and Future Prospects", IEEE Transactions on Electron Devices, vol. 64, No. 3, Mar. 2017, pp. 713-727.

* cited by examiner

FIG 6B
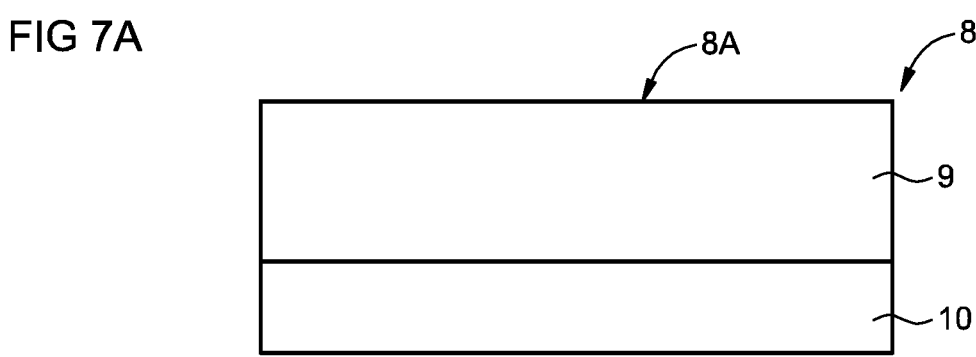
FIG 7A
FIG 7B
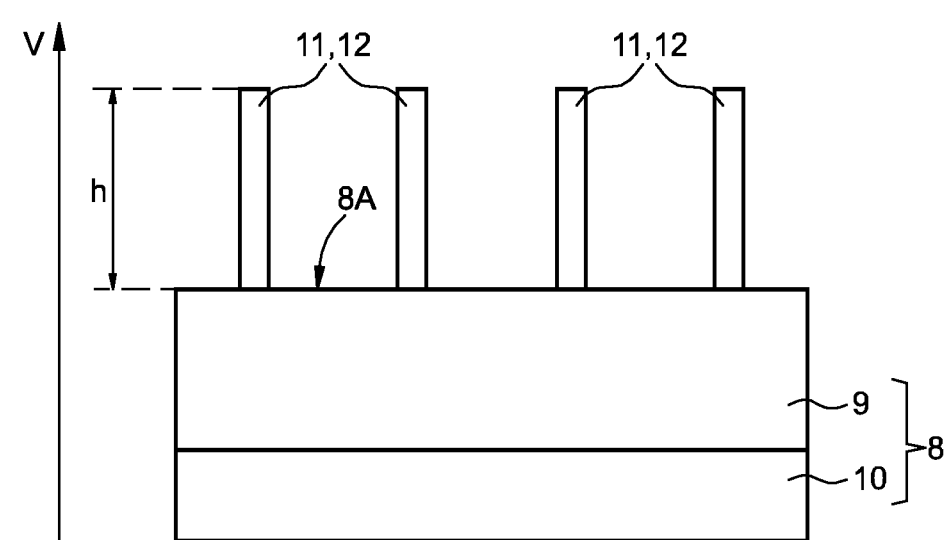

FIG 9
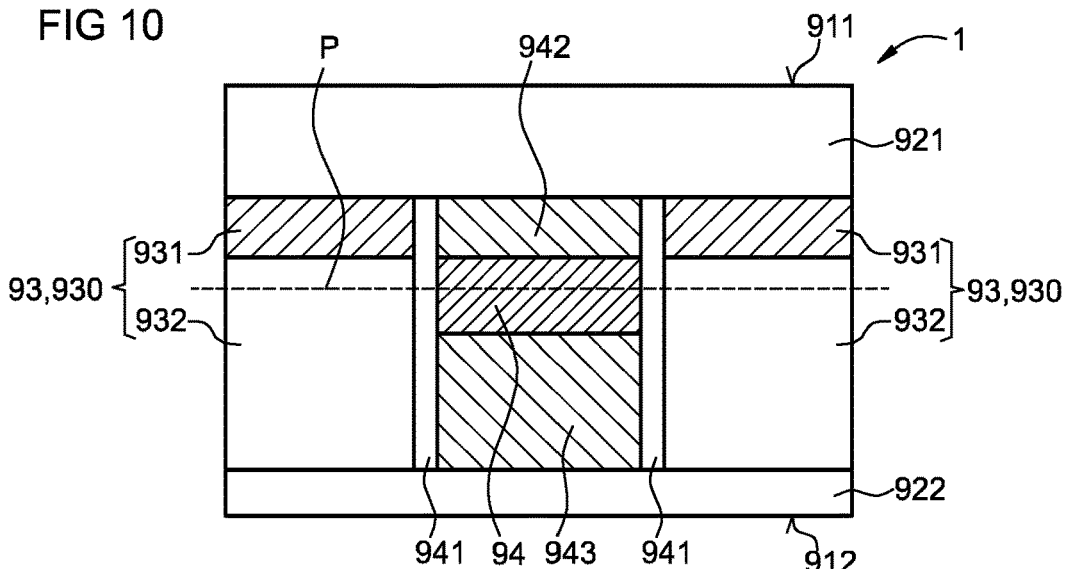
FIG 10
FIG 11
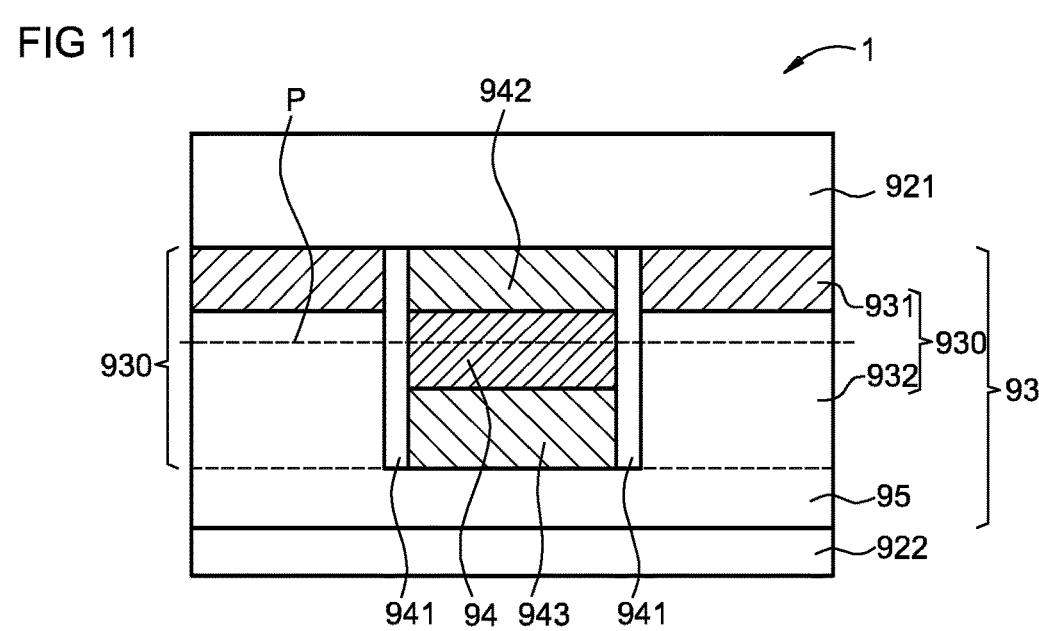

FIG 12
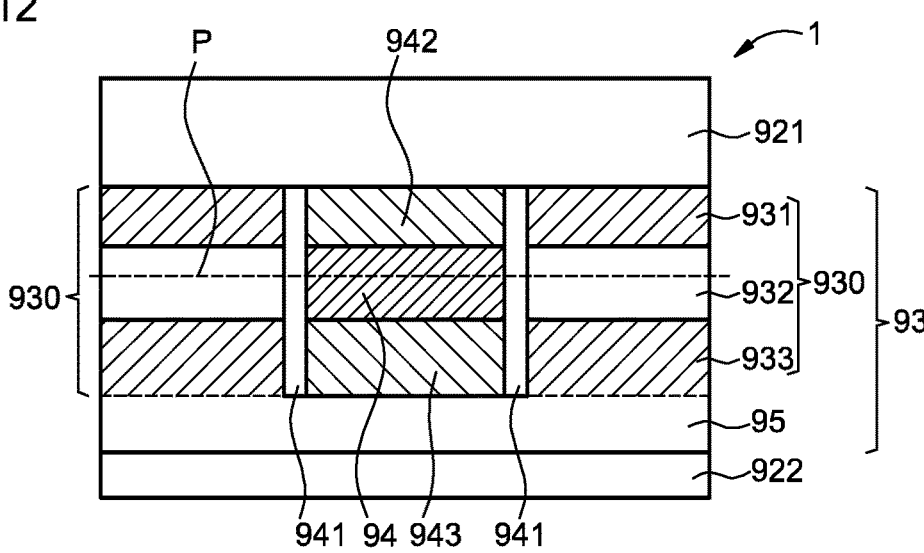
FIG 13
FIG 14
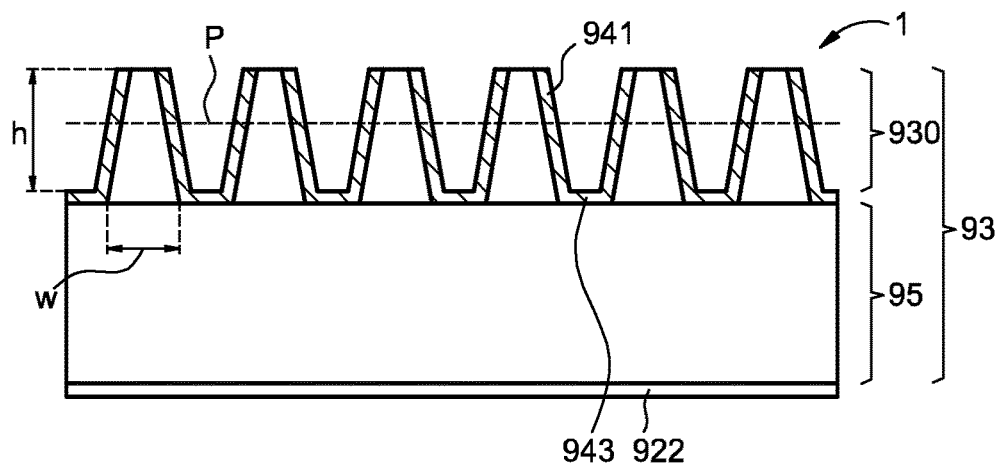

POWER SEMICONDUCTOR DEVICE AND METHOD FOR MANUFACTURING A POWER SEMICONDUCTOR DEVICE

CROSS-REFERENCE TO RELATED APPLICATIONS

This application is US National Stage of International Patent Application PCT/EP2021/086803, filed Dec. 20, 2021, which claims priority to European Patent Application No. 20216094.1, filed on Dec. 21, 2020, and European Patent Application No. 20216022.2, filed on Dec. 21, 2020, the contents of which are incorporated herein by reference.

A power semiconductor device is provided. A manufacturing method for such a power semiconductor device is also provided. The power semiconductor device may be a silicon carbide device.

Silicon carbide (SiC) based devices compared to common silicon (Si) based devices have a much higher breakdown field strength and thermal conductivity and enable reaching otherwise unattainable efficiency levels. 4H—SiC is a suitable polytype for power electronics, such as metal-oxide-semiconductor field effect transistors (MOSFETs) or accumulation-mode MOSFETs (ACCUFETs), due to the advances in the field of 4H—SiC growth technology as well as its attractive electronic properties such as the larger band gap compared to other available wafer-scale polytypes, e.g. 6H SiC or 3C—SiC. Although, 4H—SiC power MOSFETs and power ACCUFETS are already commercially available, there is large room for improvements, for example regarding inversion channel mobility of power MOSFETs in order to further decrease on-resistance $R_{on}$.

Most of the commercially available power field effect transistors based on silicon carbide (SiC) are implemented with a planar design, where a channel is formed on a surface of a wafer, such as in a vertical double diffused metal oxide semiconductor field effect transistor (VDMOS). However, current densities in these devices are difficult to increase since the p-type implantations in an n-channel VDMOS form the gates of a parasitic junction field effect transistor (JFET) that tend to reduce the width of the current flow.

Trench metal oxide semiconductor field effect transistors (MOSFETs) enable the achievement of low on-resistance $R_{on}$ because of lack of the parasitic JFET. Additionally, for SiC, the trench MOSFET architecture permits optimization of carrier mobility by designing the channel with respect to different crystallographic planes. A SiC trench MOSFET is known for example from US 2018/0350977 A1. Known methods for manufacturing SiC based trench MOSFETS rely on etching a deep trench into SiC for forming the trench-type gate electrodes. Etching SiC is difficult and costly compared to etching other semiconductor materials such as silicon (Si). Whereas for higher voltage classes >3 kV the drift layer resistance $R_{drift}$ dominates on-resistance $R_{on}$, reduction of the latter is, however, essential in commercially more relevant lower voltage classes (e.g. voltage classes ≤1.7 kV)—used for electric and hybrid electric vehicles (EVs/HEVs)—in order to significantly reduce the on-state power and switching losses. Here, $R_{on}$ is still considerably higher than ideal as shown in FIG. 1. In this respect, low inversion channel mobility represents one of the main challenges that might have significant impact on device costs and hence widespread adoption of SiC power MOSFETs. Boosting the inversion channel mobility using improved gate stacks as well as SiC/oxide interfaces showed limited success, but is known as one of the most important milestones in the development and commercialization of SiC power MOSFETs. In the late 90s, the introduction of nitric oxide (NO) post-oxidation for 6H—SiC and its application to 4H—SiC MOSFETs in 2001 enabled an enormous increase in inversion layer electron mobility, because the introduction of nitrogen (N) near the interface via NO annealing reduces the interface defect density $D_{it}$ (see FIG. 2). However, there is a strong demand for higher mobility devices beyond state-of-the-art NO annealed SiC MOSFETs particularly in order to expand SiC MOSFETs into the low voltage class markets.

Furthermore, problems that could be avoided by a higher channel mobility in addition to reaching ideal/lower $R_{on}$ are as follows:

a) the gate can be driven at lower voltages resulting in smaller electric fields in the gate oxide layer, which improves threshold stability and oxide long-term reliability, and b) aggressive scaling of the transistor channel length is not required in order to reduce the channel resistance, thus, short channel effects can be avoided.

Alternative strategies to reduce interface defects beyond the NO treatment are the introduction of interfacial layers with trace impurities, surface counter-doping, higher temperature oxidations and alternative non-polar crystal faces (instead of conventional polar Si-face) due to their inherently high mobility.

Besides the inversion channel mobility and the drift layer resistance $R_{drift}$, there are other parameters which effect the on-resistance $R_{on}$ and thus are worth improving, like, for example, the source resistance $R_S$, which represents all resistances between a source terminal of the device to a channel of the device and includes, for example, the resistance of wire bonds, of a source metallization, and of a source layer.

Documents US 2019/0371889 A1, EP 3 264 470 A1, DE 102 27 831 A1 and US 2017/0077304 A1 refer to semiconductor devices.

Documents U.S. Pat. Nos. 5,994,735 A, 5,323,040 A and US 2020/0111917 A1 refer to transistor-based semiconductor devices.

A problem to be solved is to provide a power semiconductor device having a high efficiency.

Exemplary embodiments of the disclosure address the above shortcomings, by a power semiconductor device and by a manufacturing method as defined in the independent patent claims. Exemplary further developments constitute the subject matter of the dependent patent claims.

According to at least one embodiment, the power semiconductor device comprises a first main electrode, a second main electrode and a gate electrode layer between the first main electrode and the second main electrode. Optionally, the power semiconductor device further includes a first insulating layer comprising at least one of a plurality of first insulating layer portions traversing the gate electrode layer and of at least one second insulating layer portion arranged on a side of the gate electrode layer facing the second main electrode. The second insulating layer portion may be a continuous layer or a discontinuous layer comprising a plurality of second insulating layer portions. For example, "to traverse" means "to run through".

And the power semiconductor device comprises a semiconductor layer stack between and in electrical contact with the first main electrode and the second main electrode. Here, the semiconductor layer stack being arranged "between" the first main electrode and the second main electrode means that the first main electrode and the second main electrode define a space where the semiconductor layer stack is arranged. The semiconductor layer stack contains silicon carbide.

Moreover, the semiconductor layer stack comprises differently doped semiconductor layers, wherein at least two semiconductor layers differ in at least one of their conductivity type and their doping concentration. The semiconductor layer stack further comprises a plurality of pillar-shaped or fin-shaped regions, which traverse the gate electrode layer and which each comprise a contact layer arranged at the first main electrode with a first doping concentration and with a first conductivity type. Each contact layer extends to a side of the gate electrode layer facing the first main electrode. The gate electrode layer may be laterally overgrown by the contact layers such that its side facing the first main electrode is covered at least partly by the contact layers.

During operation of the power semiconductor device, in an on-state of the power semiconductor device, that is, for example, when a positive gate bias is applied, a current flows through the semiconductor layer stack between the first main electrode and the second main electrode. In an off-state of the power semiconductor device, that is, for example, when the gate bias is zero, a current flow between the first main electrode and the second main electrode is blocked. For example, the first main electrode is the source electrode and the second main electrode is the drain electrode of the power semiconductor device. Moreover, each pillar-shaped or fin-shaped region may comprise a source layer at the first main electrode, wherein the source layer comprises the contact layer or consists of the contact layer.

The contact layers may comprise or consist of a wide bandgap material such as at least one of silicon carbide, for example 3C—SiC, or GaN. Moreover, the contact layers may be highly doped layers. For example, the first doping concentration may range between $10^{19}$ and $10^{20}$ cm$^{-3}$.

The gate electrode layer may be a highly doped Si layer or a metal layer, for example a layer of Al.

In the context of the present application, "pillar-shaped regions" may be regions having a main extension direction running obliquely or perpendicularly to a device plane, which is a main extension plane of the device. Moreover "fin-shaped regions" may be regions having a main extension direction along the device plane. For example, the pillar-shaped regions may have in each case the shape of a truncated cone, of a truncated pyramid, of a prism or of a cylinder. The fin-shaped regions may have in each case the shape of a prism.

The pillar-shaped or fin-shaped regions may be referred to as nanowires or microwires. For example, document US 2016/0351391 A1 refers to semiconductor nanowire production.

According to at least one embodiment, each pillar-shaped or fin-shaped region has a first lateral extension along the device plane, which is below 2 µm, or below 1 µm. The first lateral extension is the shorter one of two lateral extensions running obliquely to each other.

The contact layers extending to the side of the gate electrode layer facing the first main electrode have the advantage that each pillar-shaped or fin-shaped region has an increased contact area at the side facing the first main electrode. Exemplarily, the contact area of each pillar-shaped or fin-shaped region can be increased by a factor of at least 2.

The increased contact areas have the positive effect of a reduced contact resistance at the transition between the first main electrode and the contact layers and thus may reduce the source resistance $R_S$.

According to at least one embodiment of the power semiconductor device, the contact layers of adjacent pillar-shaped or fin-shaped regions merge on the side of the gate electrode layer facing the first main electrode. In other words, the contact layers of adjacent pillar-shaped or fin-shaped regions are arranged continuously on the side of the gate electrode layer facing the first main electrode.

According to at least one embodiment of the power semiconductor device, the semiconductor layer stack comprises a plurality of channel layers each assigned to one pillar-shaped or fin-shaped region and arranged at sides of the contact layers facing away from the first main electrode. The channel layers have a second doping concentration and a second conductivity type, wherein at least one of the second doping concentration differs from the first doping concentration and the second conductivity type differs from the first conductivity type. The channel layers may comprise or consist of silicon carbide, for example 3C—SiC.

For example, the first conductivity type is of n-type, whereas the second conductivity type is of p-type. However, it is also possible for the first conductivity type to be p-type and for the second conductivity type to be n-type. Moreover, the first conductivity type and the second conductivity type may be the same, for example n-type or p-type. If the first conductivity type and the second conductivity type are of the same type, for example of the n-type, the first doping concentration may exceed the second doping concentration, exemplarily by at least a factor of 10. For example, the first doping concentration may range between $10^{19}$ and $10^{20}$ cm$^{-3}$, whereas the second doping concentration may range between $10^{16}$ and $10^{17}$ cm$^{-3}$.

According to at least one embodiment of the power semiconductor device, the first insulating layer is arranged between the gate electrode layer and the channel layers such that the gate electrode layer is electrically separated from each one of the channel layers. The first insulating layer may contain or consist of at least one of silicon dioxide or silicon nitride. A layer thickness of the first insulating layer is exemplarily in a range between 5 and 500 nm, wherein the layer thickness designates a maximum extent in a direction parallel to a surface normal of the first insulating layer.

The shape of the first insulating layer portions may correspond to the shape of the lateral surfaces of the pillar-shaped or fin-shaped regions, which, as mentioned above, may each have the shape of a truncated cone, of a truncated pyramid, of a prism or of a cylinder. The first insulating layer portions may respectively extend directly on the lateral surface(s) of the plurality of pillar-shaped or fin-shaped regions so that the plurality of first insulating layer portions cover at least a portion of the contact layer of each pillar-shaped or fin-shaped region.

According to at least one embodiment of the power semiconductor device, the channel layers are at least partly arranged in a common plane with the gate electrode layer, and the first insulating layer comprises first insulating layer portions extending on lateral surfaces of the pillar-shaped or fin-shaped regions. This embodiment allows for a MOSFET or ACCUFET design of the power semiconductor device.

The principal difference between an ACCUFET using an accumulation-channel and a metal-oxide semiconductor FET using an inversion channel is the presence of a channel layer, that is, an accumulation layer, below and/or next to the first insulating layer. The thickness, length, and doping concentration of this accumulation layer can be carefully chosen so that it is completely depleted in operation.

According to at least one embodiment, for example if the power semiconductor device has an ACCUFET design, the first conductivity type and the second conductivity type are of the same type, for example of the n-type, and the first doping concentration exceeds the second doping concentration, exemplarily by at least a factor of 10. For example, the first doping concentration may range between $10^{19}$ and $10^{20}$ $cm^{-3}$, whereas the second doping concentration may range between $10^{16}$ and $10^{17}$ $cm^{-3}$.

According to at least one embodiment, for example if the power semiconductor device has a MOSFET design, the first conductivity type and the second conductivity type are different, and each pillar-shaped or fin-shaped region may comprise a drain layer of the first conductivity type arranged on a side of the channel layer facing away from the contact layer. Exemplarily, the drain layer comprises 4H—SiC or 6H—SiC.

The first insulating layer portions may respectively surround laterally partly or completely a corresponding one of the pillar-shaped or fin-shaped regions to form a plurality of vertical gate-all-around field effect transistor cells. Gate-all-around field effect transistor cells allow a most efficient gate control. In the context of the present application, "laterally" means parallel to the device plane. Here, the first insulating layer may consist of the first insulating layer portions.

The power semiconductor device may comprise a second insulating layer, which is arranged at a side of the gate electrode layer facing away from the first main electrode. Exemplarily, the second insulating layer comprises $SiO_2$. Moreover, the second insulating layer may be a spin-on-glass (SOG) layer. The second insulating layer decreases a parasitic capacitance of the gate electrode layer.

According to at least one embodiment of the power semiconductor device, for example if the power semiconductor device has a planar MOSFET design like a VDMOS design, the channel layers are arranged in a plane different from a plane of the gate electrode layer, and the first insulating layer comprises second insulating layer portions arranged on a side of the gate electrode layer facing the second main electrode. Even more, the first insulating layer may consist of the second insulating layer portions. For example, the second insulating layer portions have a planar configuration. Here, the first conductivity type and the second conductivity type may be different, and a drain layer of the first conductivity type may be arranged on sides of the channel layers facing away from the contact layers. Exemplarily, the drain layer comprises 4H—SiC or 6H—SiC. Moreover, the power semiconductor device may only comprise fin-shaped regions.

According to at least one embodiment, the power semiconductor device comprises an intermediate insulating layer arranged between the gate electrode layer and the contact layer of each pillar-shaped or fin-shaped region at least on the side of the gate electrode layer facing the first main electrode. Exemplarily, the intermediate insulating layer comprises $SiO_2$. Moreover, the second insulating layer may be a spin-on-glass (SOG) layer.

Figure 2:
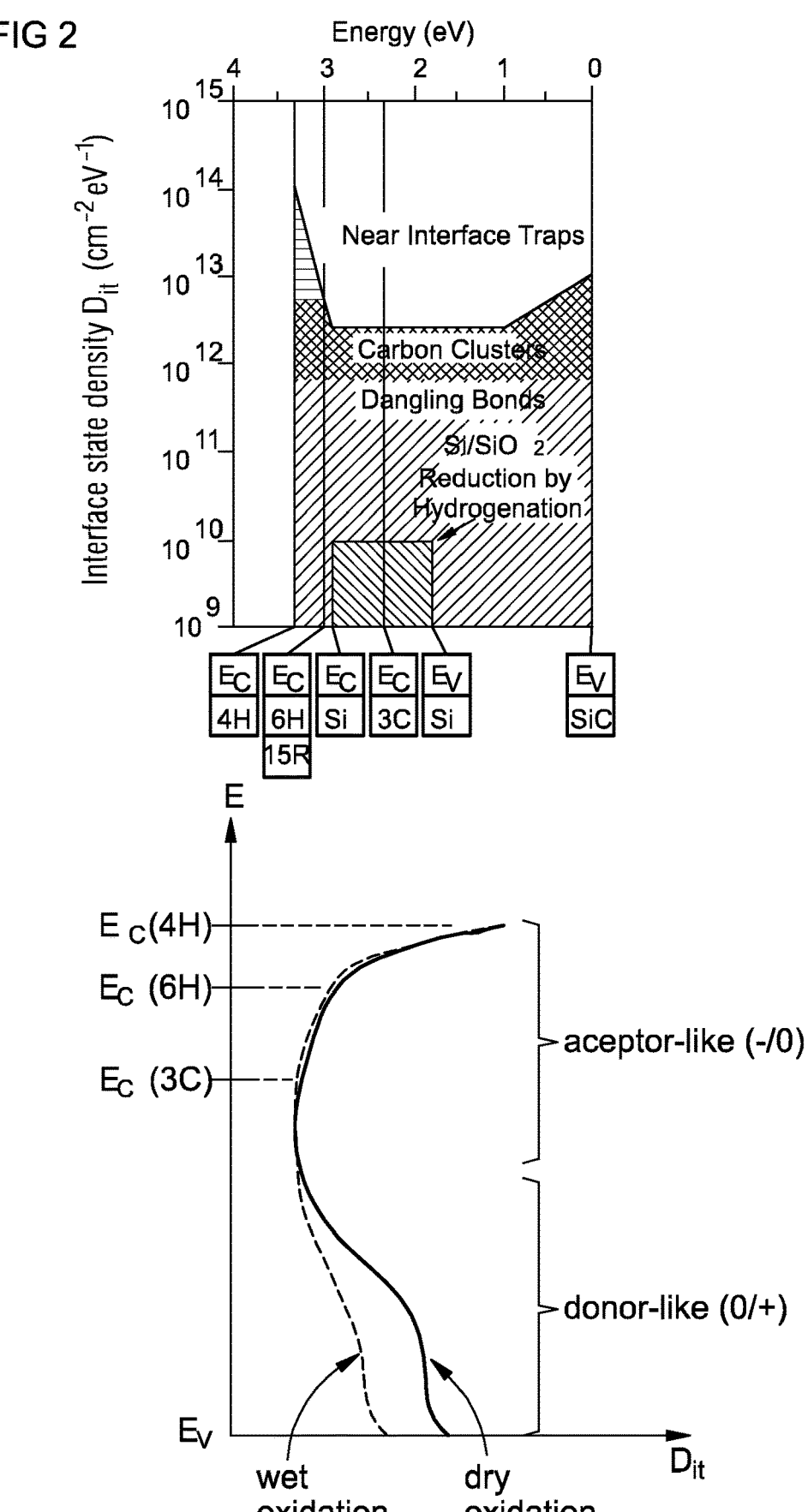

As mentioned above, the channel layer may comprise 3C—SiC and the drain layer may comprise 4H—SiC or 6H—SiC. Here, the idea is to combine the advantages of two SiC polytypes, i.e. 3C—SiC and 4H—SiC or alternatively 3C—SiC and 6H—SiC, to enable high performance SiC power devices. Whereas 4H—SiC or alternatively 6H—SiC employed in the drain layer ensures good blocking capability due to its higher band gap, 3C—SiC is employed as a channel material, since channel motilities exceeding 160 cm2/vs have been measured in 3C—SiC. In the case of SiC, near interface traps (NITs) are an important class of interface defects, which can be found inside the oxide very close to the interface in Si and SiC MOS structures. In the latter, they are responsible for the high concentration of neutral defect states near the conduction band edge (EC-ET<0.2 eV) as shown in FIG. 2. However, the distribution and density of NITs strongly depend on the polytype of SiC. While the density of NITs increases nearly exponentially towards the conduction band edge for 4H—SiC or 6H—SiC, it remains relatively low for 3C—SiC. In addition, defect states in the lower half of the band gap (close to the valence band, see FIG. 2) are donor-like and do not directly affect the n-type carrier mobility. Defect states near the conduction band, however, are acceptor-like and can be negatively charged, for instance if a gate voltage is applied. As a consequence, electrons in the inversion channel are trapped, become almost immobile and act as coolant scattering centers, which significantly limits the n-channel mobility. Therefore, 3C—SiC/oxide interfaces in power MOSFET devices exhibit lower interface defect density Dit and as a consequence higher channel mobility compared to their 4H—SiC/oxide or 6H—SiC/oxide counterparts.

In an exemplary embodiment, the power semiconductor device comprises a carrier, on which the semiconductor layer stack is arranged. The carrier may be a substrate or substrate layer onto which the semiconductor layer stack has been epitaxially grown.

According to at least one embodiment, the power semiconductor device is a power device. For example, the power semiconductor device is configured for a maximum current through the channel layer of at least 10 A or of at least 50 A. As an option, the maximum current is at most 500 A. Alternatively or additionally, the power semiconductor device is configured for a maximum voltage of at least 0.65 kV or of at least 1.2 kV. As an option, the maximum voltage may be at most 6.5 kV.

The power semiconductor device is, for example, intended for a power module in a vehicle to convert direct current from a battery to alternating current for an electric motor, for example in hybrid vehicles or plug-in electric vehicles.

In an embodiment, the power semiconductor device comprises a plurality of nano wires or micro wires, also referred to as pillars, made of a semiconductor material, and an accumulation channel is configured in the wires so that the wires can exclusively consist of material of the same conductivity type like n-type SiC.

In at least one embodiment, the power semiconductor device comprises a first main electrode, for example, a continuous metallic layer, a second main electrode, for example, another continuous metallic layer, a semiconductor layer stack between the first main electrode and the second main electrode and optionally in direct contact with the first main electrode and the second main electrode, and a gate electrode layer between the first main electrode and the second main electrode, but electrically separated from the first main electrode and the second main electrode, wherein the semiconductor layer stack comprises a plurality of pillars in contact with the first main electrode, the pillars are also referred to as nano wires or micro wires, the pillars run through the gate electrode layer, for example, completely through the gate electrode layer, also referred to as traversing the gate electrode layer, the whole semiconductor layer stack is of the same conductivity type, for example, of n-type, completely or in places from the first main electrode to the second main electrode, along directions perpendicular with a common plane, each one of the pillars comprises a top region at the first main electrode with a first doping concentration, the top region may be in direct contact with the first main electrode, at sides of the top regions facing away from the first main electrode, and in the common plane with the gate electrode layer, each of the pillars comprises a channel region with a second doping concentration, and the first doping concentration exceeds the second doping concentration by at least a factor of 5 or at least a factor of 10 or at least a factor of 50 or at least a factor of 200.

For example, the pillars each comprise a bottom region on a side of the respective channel region facing the second main electrode, and a third doping concentration of the bottom regions is the first doping concentration, with a tolerance of at most a factor of two.

Thus, in the power semiconductor device described herein the grown semiconductor layer stack from the first main electrode to the second main electrode along directions perpendicular to the common plane exclusively consists of, for example, n-type SiC in order to realize, for example, a SiC AccuFET, that is, to an Accumulation Channel Field-Effect Transistor. The principal difference between an AccuFET using an accumulation-channel and a conventional metal-oxide semiconductor FET using an inversion channel is the presence of a thin n-channel region, that is, an accumulation-layer, below and/or next to a gate insulator. The thickness, length, and n-doping concentration of this accumulation-layer can be carefully chosen so that it is completely depleted in operation.

This causes a potential barrier between, for example, an higher doped $n^+$-doped source and a lower doped n-doped drift regions resulting in a normally-off device with the entire drain voltage supported by the n-doped drift regions. Thus, the power semiconductor device can block high forward voltages at zero gate bias with low leakage currents. When a positive gate bias is applied, an accumulation channel of electrons at an insulator-SiC interface is created and, hence, a low resistance path for the electron current flow from the source to the drain is achieved. This structure offers the possibility of moving the accumulation channel away from the insulator interface, thereby removing the influence of bad interface quality on the accumulation channel mobility.

For example, a so-called 'gate-first' integration is proposed. That is, the gate insulator, the gate itself, which may be of highly doped Si or of at least one metal, and a gate passivation is deposited before the selective growth step using standard layer deposition and thermal oxidation techniques in order to assure best possible layer qualities of, for example, the gate insulator.

Accordingly, the power semiconductor device described herein may be based on selectively grown SiC pillars in a semiconductor layer stack comprising 3C SiC and 4H SiC on a substrate of, for example, doped or undoped Si, or a wide bandgap material like SiC, sapphire or GaN, wherein the power semiconductor device may be of the AccuFET design, and may be produced by means of a self-aligned gate first process.

According to at least one embodiment, the gate electrode layer is a continuous layer. Thus, there may be exactly one gate electrode layer having a plurality of holes, seen in top view, in which the pillars are located. Hence, the gate electrode may be limited to a space laterally adjacent to the pillars and may not exceed the pillars along a growth direction and/or a direction of main extent of the pillars; 'laterally' refers to a direction in parallel with the common plane in which the gate electrode layer is located. This does not exclude that the gate electrode layer is electrically contacted with at least one gate electrode line which is not located between the pillars and which may have a greater extent perpendicular to the common plane than the pillars.

According to at least one embodiment, the pillars are in contact with the first main electrode. Hence, the first main electrode may directly be produced on the pillars.

According to at least one embodiment, the common plane is perpendicular to the growth direction and/or the direction of main extent of the pillars. Accordingly, the common plane can be in parallel with the first main electrode and the second electrode. The common plane can be in a center of the gate electrode layer, seen along a height and/or the direction of main extent of the pillars.

According to at least one embodiment, the channel regions of the pillars are each in direct contact with the respective top region. Otherwise, there may be at least one intermediate region between the assigned top regions and channel regions.

According to at least one embodiment, the pillars comprise SiC or consist of SiC. Otherwise, the pillars may comprise or may consist of another high-bandgap compound semiconductor material like $Ga_2O_3$ or GaN.

According to at least one embodiment, the first doping concentration is at least $5 \times 10^{15}$ cm$^{-3}$ or at least $1 \times 10^{16}$ cm$^{-3}$ or at least $2 \times 10^{16}$ cm$^{-3}$. Alternatively or additionally, the first doping concentration is at most $5 \times 10^{17}$ cm$^{-3}$ or at most $2 \times 10^{17}$ cm$^{-3}$ or at most $1 \times 10^{17}$ cm$^{-3}$.

According to at least one embodiment, the second doping concentration is at least $1 \times 10^{18}$ cm$^{-3}$ or at least $5 \times 10^{18}$ cm$^{-3}$ or at least $1 \times 10^{19}$ cm$^{-3}$. Alternatively or additionally, the second doping concentration is at most $5 \times 10^{20}$ cm$^{-3}$ or at most $2 \times 10^{20}$ cm$^{-3}$ or at most $1 \times 10^{20}$ cm$^{-3}$.

According to at least one embodiment, seen in cross-section through the common plane and seen in parallel with the common plane, a width of the pillars is at least 0.05 μm or at least 0.1 μm or at least 0.2 μm. Alternatively or additionally, said width is at most 2 μm or at most 1.0 μm or at most 0.6 μm.

According to at least one embodiment, seen in cross-section through the common plane and seen perpendicular to the common plane, a height of the pillars is at least twice or at least 5 times the width of the pillars. Alternatively or additionally, said height is at most 50 times or at most 20 times or at most ten times the width of the pillars.

According to at least one embodiment, seen in top view of the common plane, a density of the pillars is at least $2 \times 10^5$ cm$^{-2}$ or at least $1 \times 10^6$ cm$^{-2}$ or at least $1 \times 10^7$ cm$^{-2}$. Alternatively or additionally, said density is at most $1 \times 10^8$ cm$^{-2}$ or at most $4 \times 10^7$ cm$^{-2}$ or at most $2 \times 10^7$ cm$^{-2}$.

According to at least one embodiment, at side walls of the pillars there is a gate insulator wall. For example, the gate insulator wall extends all around the pillars. For each pillar, there may be one gate insulator wall of, for example, tubular or truncated conical shape. For example, the gate insulator wall is of thermal silicon dioxide.

According to at least one embodiment, at a side of the gate electrode facing the first main electrode there is a top gate insulator layer. Alternatively or additionally, at a side of the gate electrode facing the second main electrode there is a bottom gate insulator layer. The top gate insulator layer and the bottom gate insulator layer can be in direct contact with the first main electrode and the second main electrode, respectively. For example, top gate insulator layer and/or the bottom gate insulator layer are of silicon dioxide.

According to at least one embodiment, the top gate insulator layer terminates flush with the top regions of the pillars, for example, with a tolerance of at most 0.3 μm or of at most 0.1 μm. That is, a side of the top regions and a side of the top gate insulator layer facing away from the first main electrode may be in a same or approximately in a same plane in parallel with the common plane.

According to at least one embodiment, the pillars each comprise a bottom region on a side of the respective channel region facing the second main electrode. The bottom regions can be in direct contact with the assigned channel region. Alternatively or additionally, the bottom regions may be in direct contact with the second main electrode.

According to at least one embodiment, a third doping concentration of the bottom regions is the first doping concentration, for example, with a tolerance of at most a factor of five or of at most a factor of two or of at most a factor of 1.5. Hence, the top regions and the bottom regions may be of the same or approximately of the same conductivity.

According to at least one embodiment, the bottom gate insulator layer terminates flush with the bottom regions of the pillars, for example, with a tolerance of at most 0.3 μm or of at most 0.1 μm. That is, a side of the bottom regions and a side of the bottom gate insulator layer facing the first main electrode may be in a same or approximately in a same plane in parallel with the common plane.

According to at least one embodiment, the pillars have in each case the shape of a truncated cone, of a truncated pyramid, of a prism or of a cylinder. If the pillars are shaped like a truncated cone or a truncated pyramid, an opening angle of the truncated cones or truncated pyramid is, for example, at least 10° or at least 20° and/or at most 70° or at most 35° or at most 25°. Said opening angle is determined, for example, in a plane perpendicular to the common plane and though a center axis of the respective pillar. A truncated cone or a truncated pyramid is a cone or a pyramid from which the tip has been removed. It is not necessary that the tip has been removed by a cut perpendicular to an axis of the cone or pyramid, but also oblique cuts can be realized. Further, a basis of the respective cone or pyramid does not need to be a face perpendicular to the axis of the cone or pyramid, but can be arranged in an oblique manner, too.

According to at least one embodiment, the pillars are also in contact with the second main electrode. Hence, the pillars extend from the first main electrode to the second main electrode. Accordingly, the semiconductor layer stack can consist of the plurality of pillars.

According to at least one embodiment, the semiconductor layer stack further comprises one or a plurality of base layers. For example, the at least one base layer is a continuous layer. The at least one base layer is located at a side of the pillars facing away from the first main electrode. The at least one base layer can be arranged in parallel with the common plane.

According to at least one embodiment, all the pillars are in contact with the at least base layer. For example, the at least one base layer is a growth basis for the pillars. It is possible that the at least one base layer comprises a substrate or is a substrate of the semiconductor layer stack.

According to at least one embodiment, the pillars and the at least one base layer comprise at least one of different semiconductor materials and different crystallographic structures. For example, the base layer is of 4H n-type SiC and the pillars are of 3C n-type SiC.

According to at least one embodiment, the base layer comprises a superjunction structure. That is, in the base layer there can be columns of n-type and p-type semiconductor material adjacent to one another. These columns may be separated from each other in each case by a tube of an insulator material like an oxide or a nitride, for example, silicon dioxide. The tubes can have very thin walls, for example with a wall thickness of at most 50 nm or of at most 20 nm or of at most 10 nm. However, the pillars traversing or running through the gate electrode layer are still completely of one conductivity type. If there is no superjunction structure, the complete semiconductor layer stack is of only one conductivity type.

A footprint of the tubes is, for example, square or circular or polygonal or elliptic.

According to at least one embodiment, the power semiconductor device is a field-effect transistor, FET for short, or is comprised in a FET. Otherwise, the power semiconductor device can be part of an insulated-gate bipolar transistor, IGBT, which may additionally comprise an additional semiconductor layer stack as a collector region.

For example, at side walls of the pillars there is a gate insulator wall all around the pillars, and at a side of the gate electrode facing the first main electrode there is a top gate insulator layer and at a side of the gate electrode facing the second main electrode there is a bottom gate insulator layer, and the gate insulator walls are of a thermal oxide.

For example, the bottom gate insulator layer terminates flush with the bottom regions of the pillars.

For example, the pillars are in contact with the second main electrode so that the pillars extend from the first main electrode to the second main electrode.

For example, the semiconductor layer stack (3) further comprises a base layer which is a continuous layer and which is located at a side of the pillars facing away from the first main electrode in parallel with the common plane, all the pillars are in contact with the base layer, and the pillars and the base layer comprise at least one of different semiconductor materials and different crystallographic structures.

For example, the base layer comprises a superjunction structure and/or the power semiconductor device is a field-effect transistor.

A method for producing a power semiconductor device is additionally provided. By means of the method, for example, a power semiconductor device is produced as indicated in connection with at least one of the above-stated embodiments. Features of the power semiconductor device are therefore also disclosed for the method and vice versa.

In at least one embodiment, the method for producing a power semiconductor device comprises:
A) providing a substrate,
B) providing a semiconductor mask on the substrate for pillars or fins of a semiconductor layer stack,
C) forming tubes or form boards of an insulator material at side walls of the semiconductor mask, and
D) growing the semiconductor layer stack comprising SiC in or around the tubes or form boards,
wherein the tubes or form boards are maintained in the finished power semiconductor device.

In at least one embodiment, the method for producing a power semiconductor device comprising the following steps, for example, in the stated order:
A) providing a semiconductor substrate,
B) providing a semiconductor mask on the semiconductor substrate for pillars of a semiconductor layer stack, C) forming tubes of an insulator material at side walls of the semiconductor mask, and D) growing the pillars comprising, for example, SiC, in or around the tubes, the tubes are still present in the finished power semiconductor device.

Instead of a semiconductor mask, an oxide mask or a nitride mask may also be used.

One challenge for power semiconductor devices described herein like low voltage class power SiC MOS-FETs is the low inversion channel mobility and, thus, poor on-resistance. Especially for devices which could be used for electric and hybrid electric vehicles enhanced channel mobility is key to improve switching and conduction losses.

In the power semiconductor devices described herein, for example, the vertical SiC power MOSFET design using selectively grown SiC tubes is suggested. Whereas a standard n+-type 4H SiC substrate and epitaxial n⁻-type 4H SiC can be used as drift layer, selectively grown n-type 3C SiC which exhibits high carrier mobility is supposed to be the channel and source region. Thus, this concept combines the advantages of two SiC polytypes, namely 3C SiC and 4H SiC, to enable power semiconductor devices like high performance SiC power MOSFETs, for example, for low voltage applications.

With this method, improved superjunction structures, SJ structures for short, can be produced. Whereas in conventional superjunction structures n-type and p-type doped semiconductor regions are in direct contact, in the method described here a superjunction structure can also be formed with a thin insulator layer, like an oxide, in between the alternatively doped semiconductors; 'thin' means, for example, a thickness of at least 1 nm and/or of at most 10 nm.

Since this insulator layer might be used as a growth mask material for selective epitaxy, a further advantage is a two-step selective epi-growth of an in-situ doped superjunction with a layer thickness of, for example, more than 10 μm. Moreover, when using patterned stripe, hexagonal or square or other growth masks, the density of defects arising from a lattice mismatch or the substrate itself can be significantly reduced due to defect trapping along an semiconductor/insulator interface, also referred to as aspect ratio trapping. Thus, crystal defects will not extend into the superjunction structure itself and high channel carrier mobility can be achieved.

According to at least one embodiment, method step B) comprises the following sub-steps:

B1) growing a continuous starting layer or an already structured starting layer, B2) optionally, structuring the continuous starting layer so that the semiconductor mask is provided, the semiconductor mask is a positive of the pillars.

According to at least one embodiment, the semiconductor mask is completely removed after step C) and before step D). That is, the mask is not present when growing the pillars and consequently is not present in the finished device.

According to at least one embodiment, in step D) the pillars are selectively grown in the tubes and a space between adjacent tubes is free of any solid material. Accordingly, the pillars may be grown on all locations where no material of the tubes is located on the substrate. A growth of the pillars is thus limited to the tubes and along the tubes.

According to at least one embodiment, the method comprises:

E) producing the gate electrode layer between the pillars. Step E) may be done after step D) or otherwise before step D).

According to at least one embodiment, in method step B) the semiconductor mask is provided as a negative of the pillars, wherein after step C) a space between adjacent tubes is filled with at least one filling material or with at least one further semiconductor material in a step C1). For example, between steps C1) and D) the semiconductor mask can be removed. In this case, the semiconductor mask can completely be removed after step C) and before step D).

According to at least one embodiment, the semiconductor substrate is a Si substrate. Otherwise the semiconductor substrate is of SiC, GaN or sapphire.

According to at least one embodiment, the semiconductor substrate is removed after step D). Thus, the semiconductor substrate is not present in the finished power semiconductor device. Otherwise, the semiconductor substrate can be part of the semiconductor layer stack and, thus, can be an integral part of the finished power semiconductor device.

In at least one embodiment, the method for manufacturing a power semiconductor device according to any one of the preceding embodiments comprises the following:

providing a substrate, forming a sacrificial layer on a first main side of the substrate, structuring the sacrificial layer to form a plurality of sacrificial structures protruding from the first main side and having the shape of a pillar or a fin, forming an insulating material layer on at least one, exemplarily each, of the plurality of sacrificial structures and the first main side, wherein at least a part of the insulating material layer forms the first insulating layer in the power semiconductor device, removing at least one, exemplarily each, sacrificial structure to form at least one cavity, exemplarily a plurality of cavities, in the insulating material layer, forming the gate electrode layer on a second portion or second portions of the insulating material layer which form(s) the at least one second insulating layer portion in the power semiconductor device, forming a semiconductor layer of the first conductivity type selectively on the first main side to form a contact layer in the at least one, exemplarily each, cavity extending to a side of the gate electrode layer facing away from the substrate, forming the first main electrode on a side of the semiconductor layer stack facing away from the substrate, forming the second main electrode on a side of the semiconductor layer stack facing away from the first main electrode.

For example, document US 2011/0124169 A1 refers to methods of selectively depositing an epitaxial layer.

Compared to the methods for manufacturing SiC based trench-type power MOSFETs no step of etching a deep trench in SiC is required in the above-described method. This facilitates manufacturing in view of the difficulties to form deep trenches in SiC by etching.

In an exemplary embodiment the sacrificial layer comprises amorphous silicon. Each sacrificial structure may have a vertical extension in a vertical direction perpendicular to the first main side in a range between 50 nm and 10 μm, exemplarily in a range between 5 and 10 μm.

In an exemplary embodiment, the insulating material layer is formed by thermal oxidation of the sacrificial structures. Thermal oxidation allows to form the insulating material layer with very stable oxide material providing good properties for the gate insulating layer and having good mechanical characteristics, which is advantageous for use of the insulating material layer as a gate dielectric.

Processes for removing portions of the insulating material layer may include masking and etching techniques.

According to at least one embodiment, the method comprises forming the semiconductor layer of the first conductivity type, which is provided to form the contact layers, after producing the gate electrode layer. This refers to a so-called 'gate-first' integration, where the gate electrode layer and even more layers like the second insulating layer and the intermediate insulating layer are deposited before selectively forming/growing the pillar-shaped or fin-shaped regions. However, it is also possible to selectively grow the pillar-shaped or fin-shaped regions before producing the gate electrode layer and possibly the second insulating layer and the intermediate insulating layer.

According to at least one embodiment, the method comprises selectively forming a semiconductor layer of the second conductivity type on the first main side in each cavity between the contact layers and the substrate to form the channel layers. This embodiment is suited for realizing a MOSFET or ACCUFET design of the power semiconductor device.

According to at least one embodiment, the method comprises selectively forming a semiconductor layer of the first conductivity type on the first main side in each cavity between the channel layers and the substrate to form the drain layers. This embodiment is suited for realizing a MOSFET design of the power semiconductor device.

In an exemplary embodiment, forming the semiconductor layer of the first conductivity type to form the contact layers is respectively performed at a temperature below 1400° C. Temperatures above 1400° C. may damage the insulating material layer, which is used as a gate dielectric in the power semiconductor device. For example, a silicon oxide material is damaged at temperatures above 1400° C. Forming other semiconductor layers of the semiconductor layer stack may be respectively performed at a temperature below 1400° C., too.

In an exemplary embodiment the method comprises forming a second insulating layer on the insulating material layer before forming the gate electrode layer, such that after forming the gate electrode layer, the second insulating layer is sandwiched in a vertical direction perpendicular to the first main side between the insulating material layer and the gate electrode layer. Exemplarily, the second insulating layer is a spin-on-glass (SOG) layer.

The method described above is suitable for the production of power semiconductor devices described here. Features described in connection with the power semiconductor device thus also apply to the method and vice versa.

A power semiconductor device and a method described herein are explained in greater detail below by way of exemplary embodiments with reference to the drawings. Elements which are the same in the individual figures are indicated with the same reference numerals. The relationships between the elements are not shown to scale, however, but rather individual elements may be shown exaggeratedly large to assist understanding.

Figure 3A:
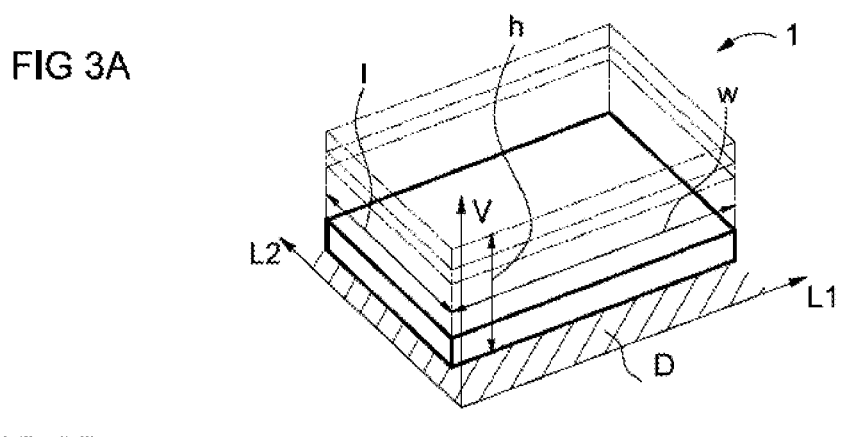
Figure 3B:
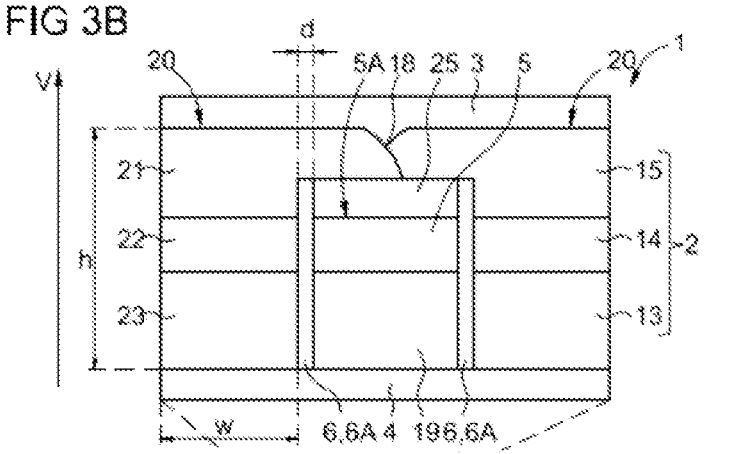
Figure 3C:
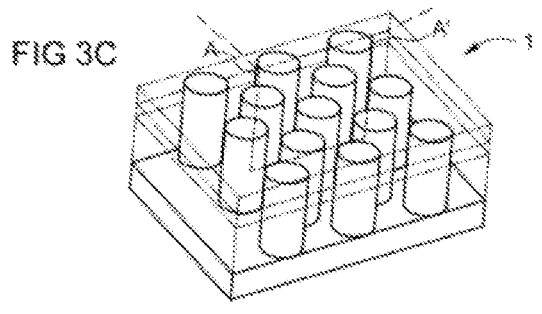
Figure 3D:
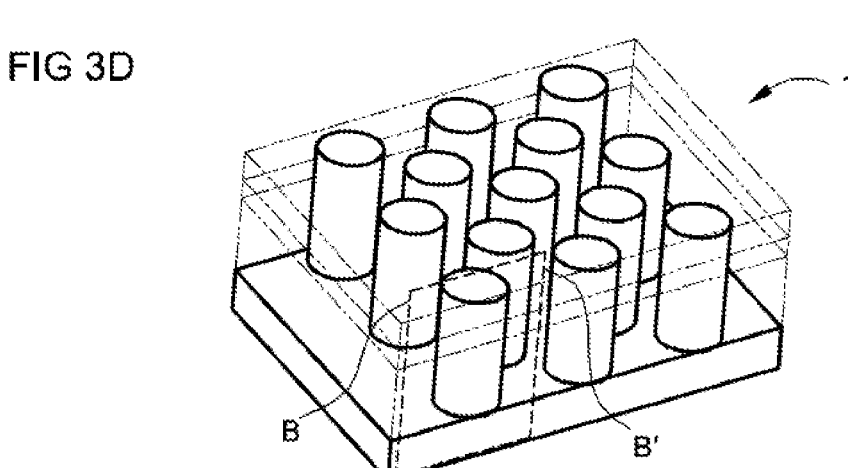
Figure 3E:
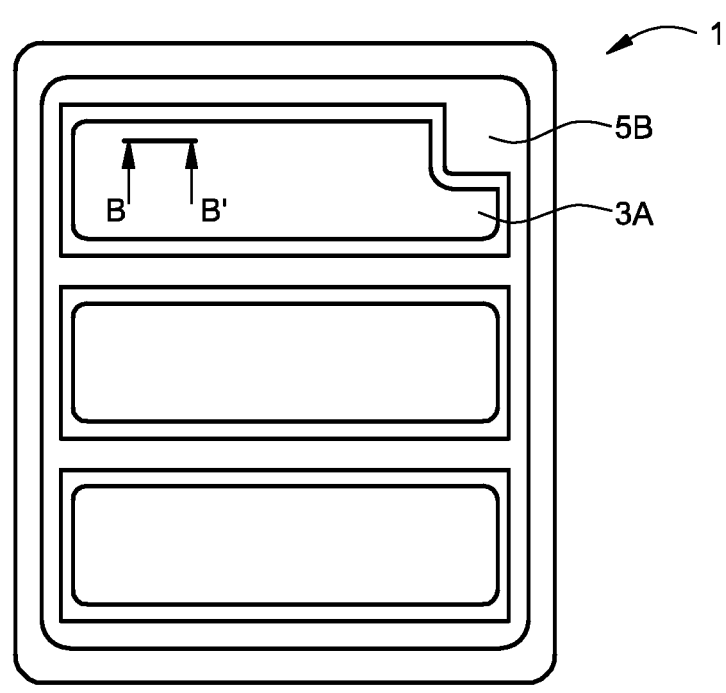
Figure 3F:
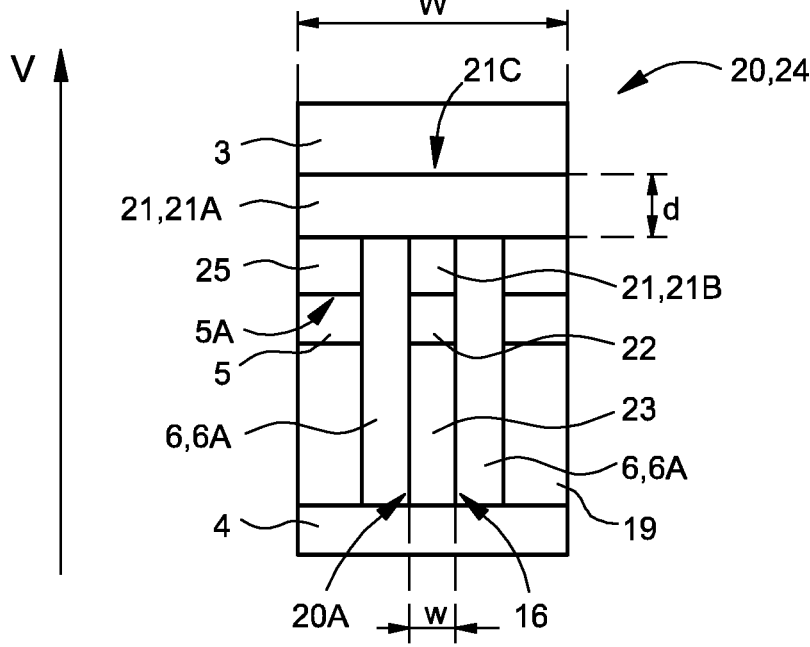
Figure 4A:
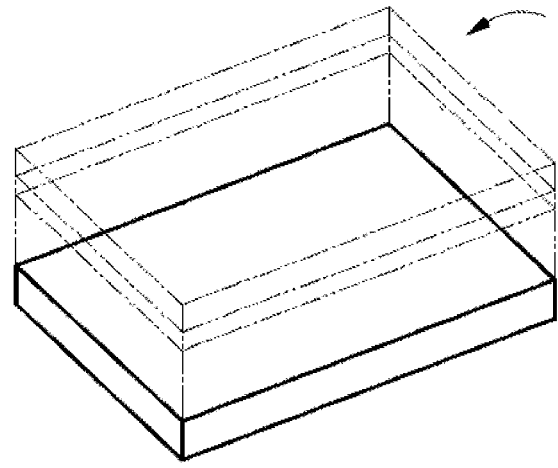
Figure 4B:
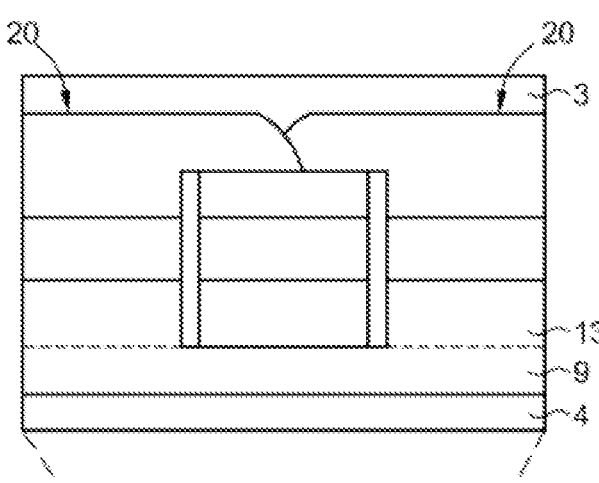
Figure 4C:
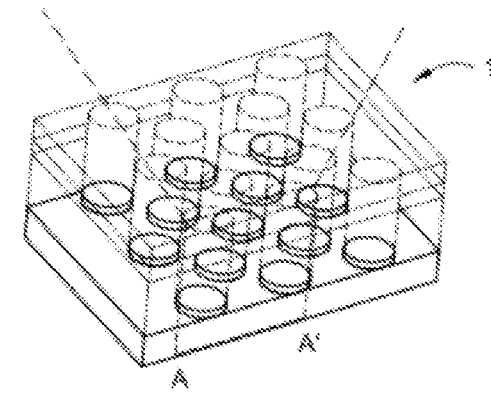
Figure 4D:
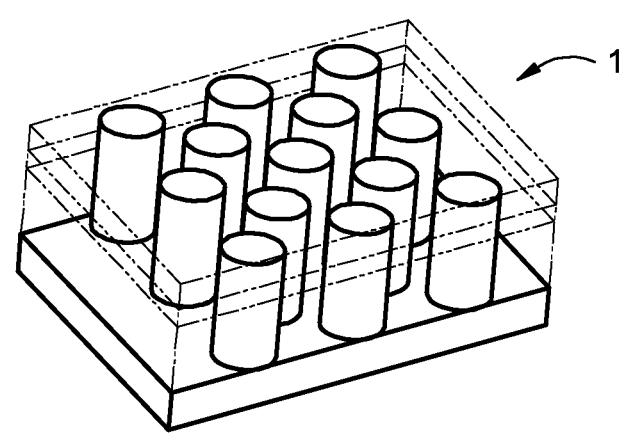
Figure 5:
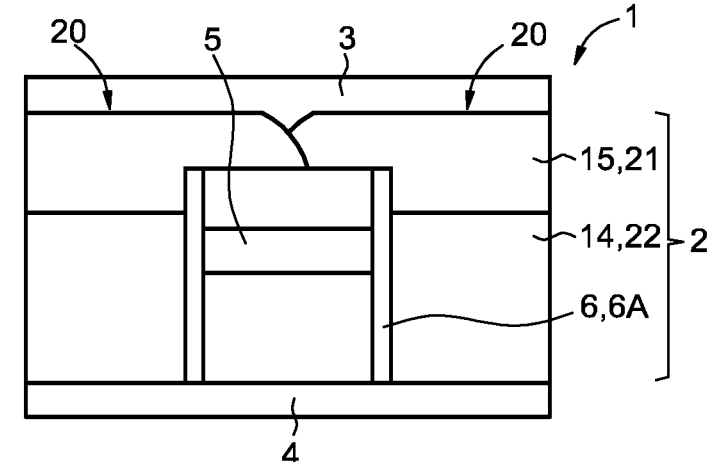
Figure 6A:
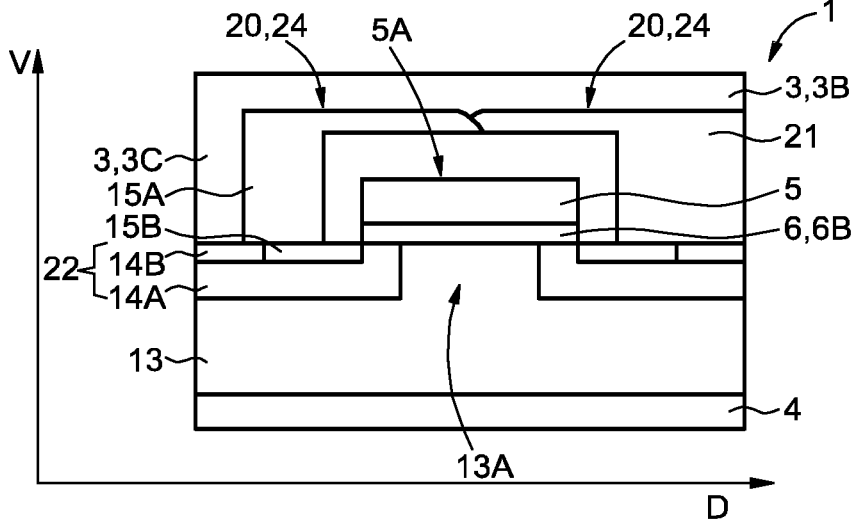
Figure 20:
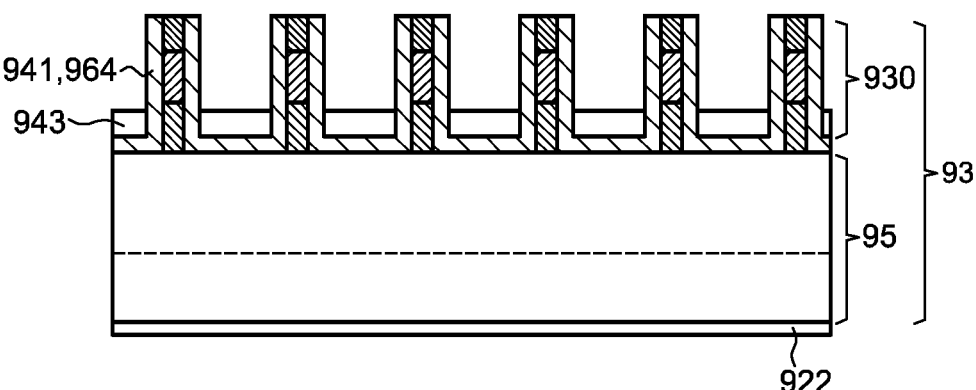
Figure 21:
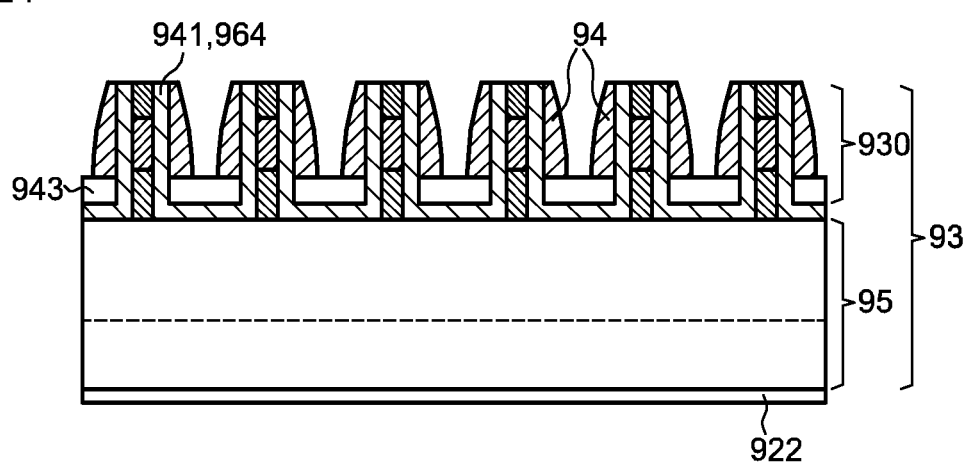
Figure 22:
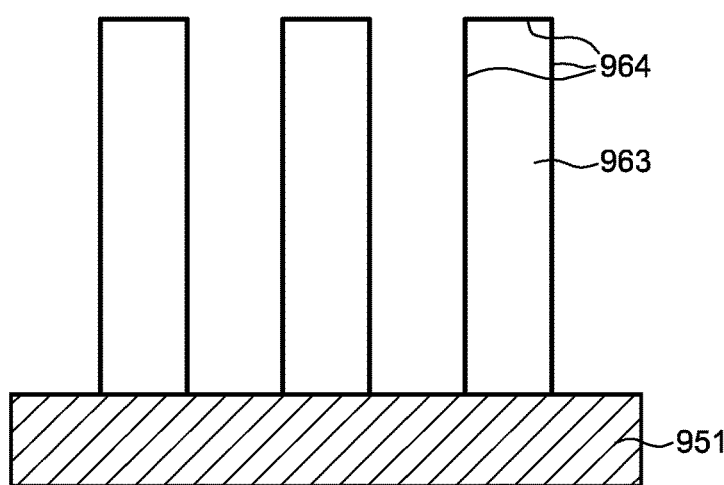
Figure 23:
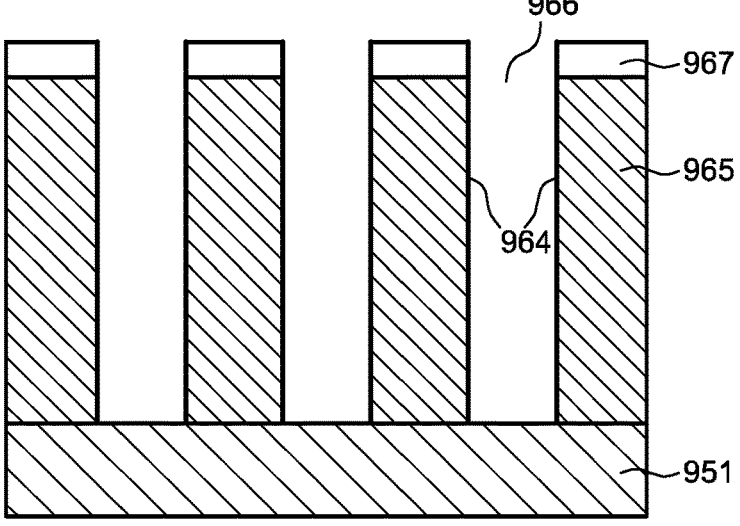
Figure 24:
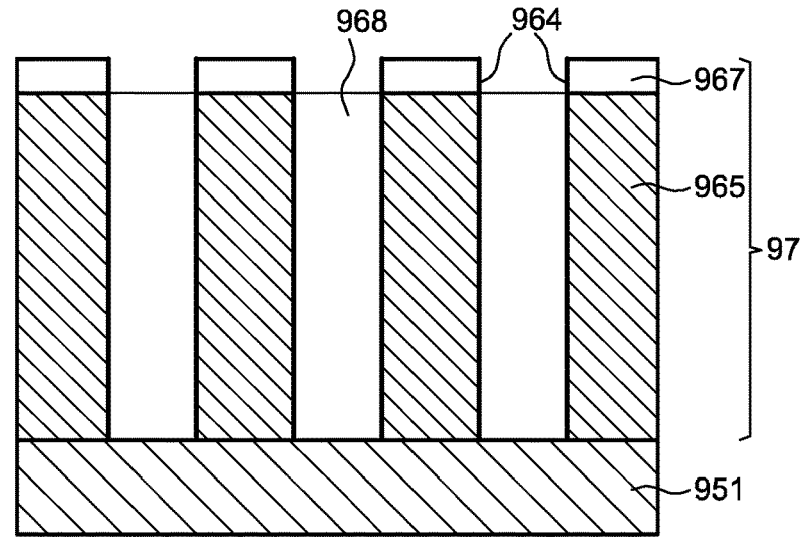
Figure 25:
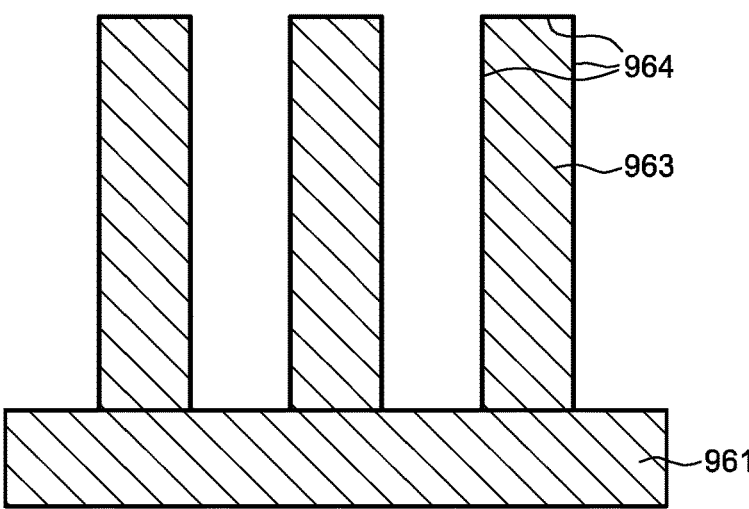
Figure 26:
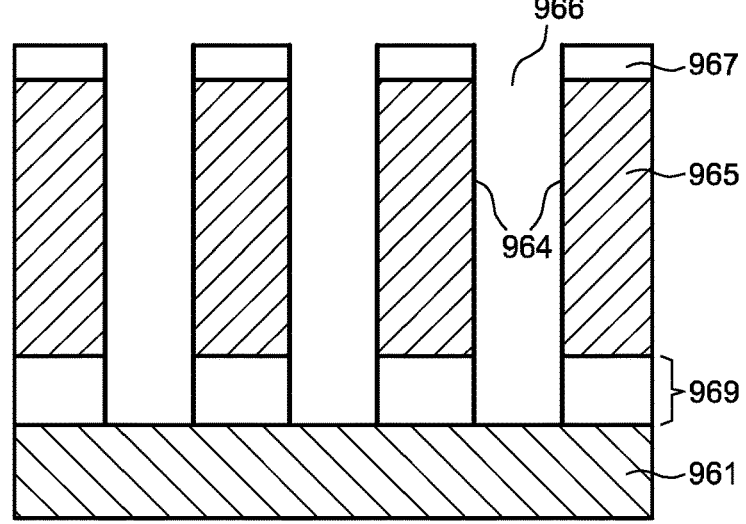
Figure 27:
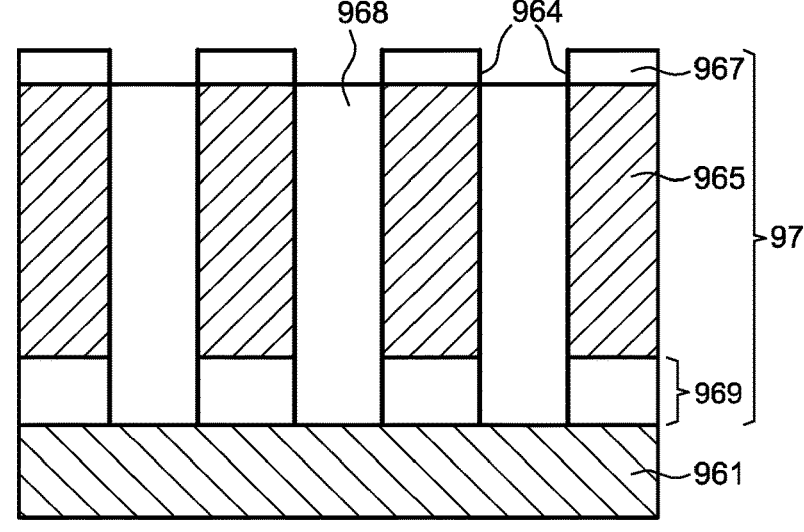
Figure 28:
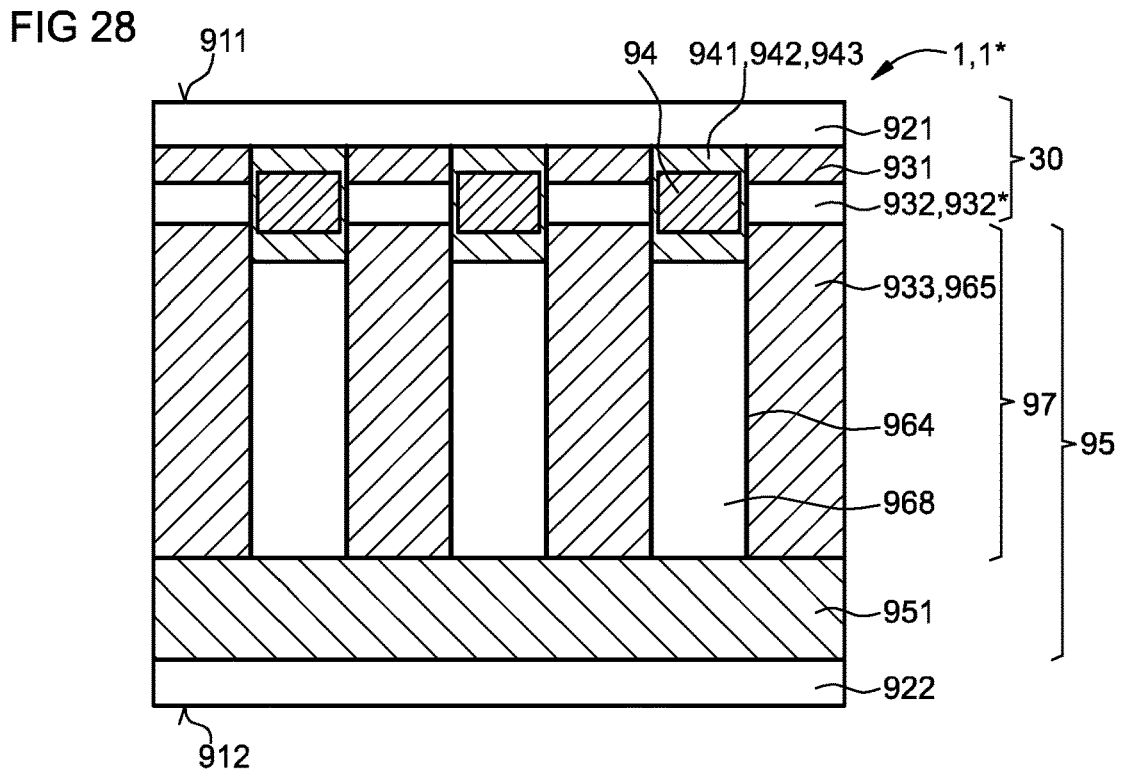
Figure 29:
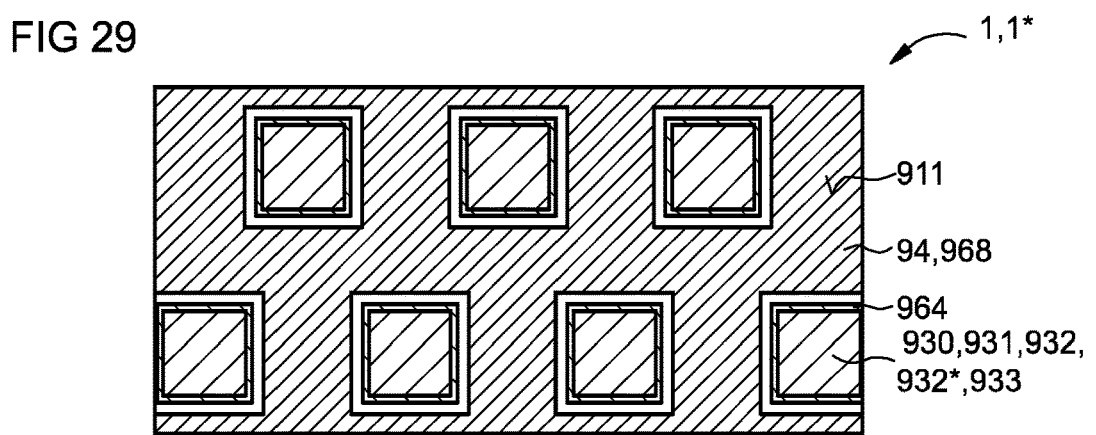
Figure 30:
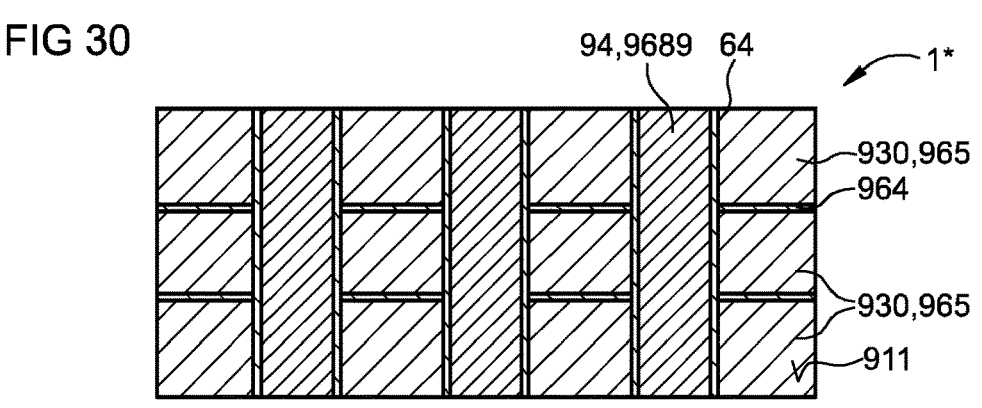
Figure 31:
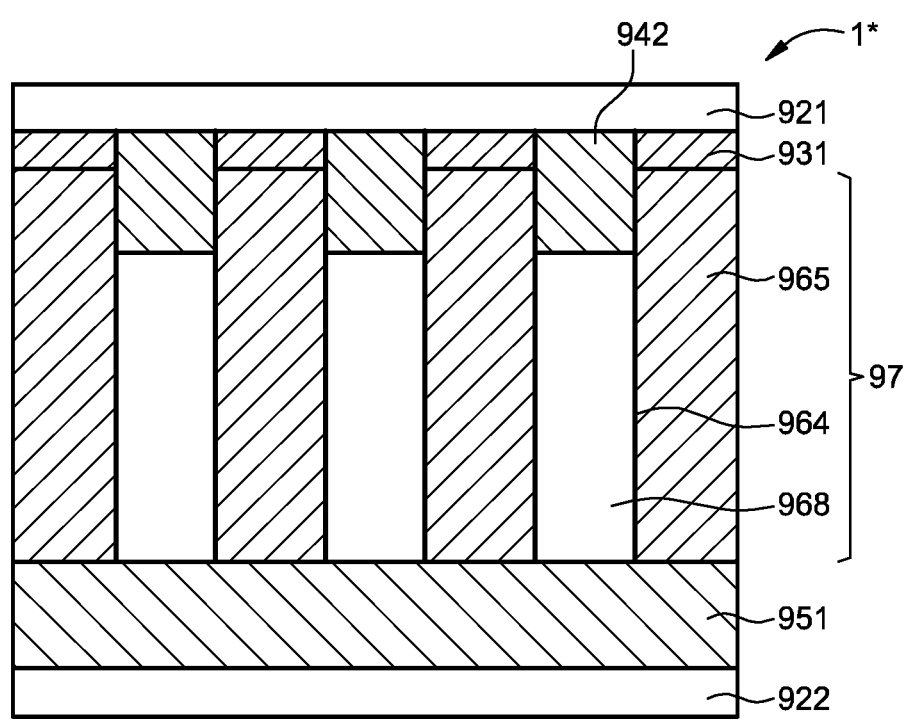
Figure 32:
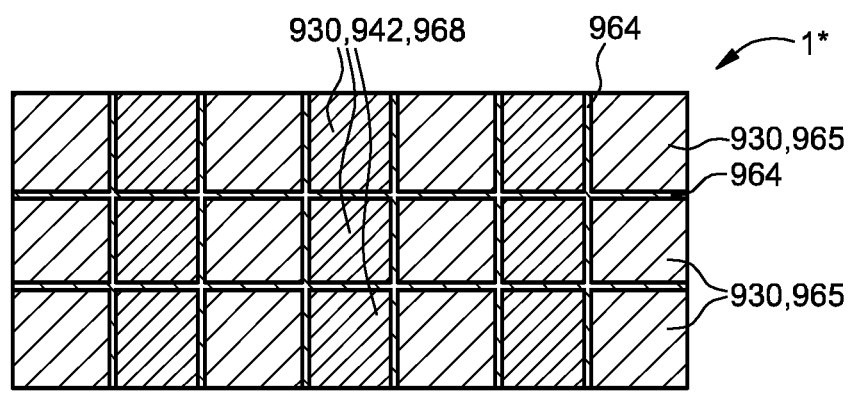

In the figures:

FIG. 1 illustrates the performance of state-of-the-art 4H—SiC power MOSFETs,

FIG. 2 illustrates the distribution of interface states inside the band gap of various SiC polytypes, FIGS. 3A, 3C and 3D show schematic perspective views, FIGS. 3B and 3F show schematic cross-sectional views and FIG. 3E shows a top view of a first exemplary embodiment of a power semiconductor device, FIGS. 4A, 4C and 4D show schematic perspective views and FIG. 4B shows a schematic cross-sectional view of a second exemplary embodiment of a power semiconductor device, FIG. 5 shows a schematic cross-sectional view of a third exemplary embodiment of a power semiconductor device, FIGS. 6A and 6B show schematic cross-sectional views of a forth exemplary embodiment of a power semiconductor device, FIGS. 7A to 7F illustrate a method for manufacturing a semiconductor power device according to one of the first to third exemplary embodiments, FIGS. 8A to 8E illustrate a method for manufacturing a semiconductor power device according to the forth exemplary embodiment, FIG. 9 is a schematic perspective view of an exemplary embodiment of a power semiconductor device described herein, FIG. 10 is a schematic sectional view of the power semiconductor device of FIG. 9, FIGS. 11 to 14 are schematic sectional views of exemplary embodiments of power semiconductor devices described herein, FIGS. 15 to 21 are schematic sectional views of method steps of an exemplary embodiment of a method to produce power semiconductor devices described herein, FIGS. 22 to 24 are schematic sectional views of method steps of an exemplary embodiment of a method to produce power semiconductor devices described herein, FIGS. 25 to 27 are schematic sectional views of method steps of an exemplary embodiment of a method to produce power semiconductor devices described herein, FIG. 28 is a schematic perspective view of an exemplary embodiment of a power semiconductor device described herein, FIG. 29 is a schematic top view of the power semiconductor device of FIG. 28, FIG. 30 is a schematic top view of another exemplary embodiment of the power semiconductor device of FIG. 28, FIG. 31 is a schematic perspective view of an exemplary embodiment of a power semiconductor device described herein, and FIG. 32 is a schematic top view of the power semiconductor device of FIG. 31.

FIGS. 3A to 3F show different schematic views of a first exemplary embodiment of a power semiconductor device 1, wherein FIG. 3B is a cross-sectional view taken along plane A-A' shown in FIG. 3C, and FIG. 3F is a cross-sectional view taken along plane B-B' shown in FIG. 3D.

The power semiconductor device 1 according to the first exemplary embodiment has a cuboid shape defined by a first lateral extension w along a first lateral extension direction L1, a second lateral extension 1 along a second lateral extension direction L2 perpendicular to the first lateral extension direction L1 and a vertical extension h in a vertical direction V perpendicular to a device plane D spanned by the first lateral extension direction L1 and the second lateral extension direction L2 (see FIG. 3A).

The power semiconductor device 1 comprises a first main electrode 3, a second main electrode 4 and a semiconductor layer stack 2 between and in electrical contact with the first main electrode 3 and the second main electrode 4 (see FIGS. 3A and 3B). The semiconductor layer stack 2 is sandwiched in the vertical direction V between the first main electrode 3 and the second main electrode 4. "In electrical contact"

means that during operation, for example in an on-state of the power semiconductor device 1, a current flows through the semiconductor layer stack 2 between the first main electrode 3 and the second main electrode 4. The first and the second main electrodes 3, 4 are, for example, metallic electrodes. The first main electrode 3 may be a source electrode and the second main electrode 4 may be a drain electrode. The power semiconductor device 1 has a MOS-FET design.

As becomes evident from FIG. 3B, the semiconductor layer stack 2 comprises differently doped semiconductor layers 13, 14, 15 stacked one on top of the other in the vertical direction V, wherein semiconductor layer 15 is highly n-doped and has a first doping concentration, semiconductor layer 14 is highly p-doped and has a second doping concentration and semiconductor layer 13 is n-doped and has a third doping concentration, which is less than that of semiconductor layer 15. For example, the first doping concentration may exceed the third doping concentration, exemplarily by at least a factor of 10. For example, the first doping concentration may range between $10^{19}$ and $10^{20}$ cm$^{-3}$, whereas the third doping concentration may range between $10^{16}$ and $10^{17}$ cm$^{-3}$. Moreover, the second doping concentration may range between $10^{16}$ and $10^{18}$ cm$^{-3}$.

The semiconductor layers 13, 14, 15 are each discontinuous layers.

The semiconductor layer stack 2 is based on silicon carbide, which means that at least one of the semiconductor layers 13, 14, 15 of the semiconductor layer stack 2 comprises or consists of SiC. The semiconductor layers 13, 14, 15 may be of any SiC polytype. Layers 13, 14, 15 may be of different SiC polytypes or of the same SiC polytype. In an exemplary embodiment, layer and layer 14 may each comprise 3C—SiC whereas layer 13 may comprise 4H—SiC or 6H—SiC.

The power semiconductor device 1 comprises a gate electrode layer 5 between the first main electrode 3 and the second main electrode 4, wherein "between" in this case means sandwiched in the vertical direction V (see FIG. 3B). The gate electrode layer 5 may be a highly doped Si layer or a metal layer, for example a layer of Al.

The power semiconductor device 1 comprises a first insulating layer 6 comprising a plurality of first insulating layer portions 6A traversing the gate electrode layer 5. The first insulating layer 6 contains or consists of at least one of silicon dioxide or silicon nitride. Exemplarily, the first insulating layer 6 is a thermal oxide layer. A layer thickness d of the first insulating layer 6 is exemplarily in a range between 5 and 500 nm, wherein the layer thickness d designates a maximum extent in a direction parallel to a surface normal of the first insulating layer 6.

Moreover, as becomes evident from FIG. 3C and FIGS. 3D, the semiconductor layer stack 2 comprises a plurality of pillar-shaped regions 20, which traverse the gate electrode layer 5 and each comprise a contact layer 21 arranged at the first main electrode 3 with a first doping concentration and with a first conductivity type, wherein each contact layer 21 is a part of the semiconductor layer 15 and thus has the same qualities as described in connection with the semiconductor layer 15. For example, the contact layers 21 serve as source layers of the power semiconductor device 1. Moreover, each of the plurality of pillar-shaped regions 20 comprises a part of semiconductor layer 14 and semiconductor layer 13, wherein the parts of semiconductor layer 14 are channel layers 22 and the parts of semiconductor layer 13 are drain layers 23 of the power semiconductor device 1. The channel layers 22 are arranged in a common plane with the gate electrode layer 5.

The pillar-shaped regions 20 may have a vertical extension h larger than their lateral extension w. Exemplarily, the vertical extension h might be at least 2 or 3 times larger than the lateral extension w.

As illustrated in FIG. 3D the plurality of pillar-shaped regions 20 may be arranged in form of a matrix. The number of pillar-shaped regions 20 is not restricted to the one shown in the Figures, but may exceed this number or fall below this number.

Each contact layer 21 extends to a side 5A of the gate electrode layer 5 facing the first main electrode 3. As becomes evident from FIG. 3B, the contact layers 21 of adjacent pillar-shaped regions 20 are arranged continuously on the side of the gate electrode layer 5 facing the first main electrode 3. The continuously arranged contact layers 21 allow for a mainly planar surface of the semiconductor layer stack 2 facing the first main electrode 3, which simplifies the application of the first main electrode 3.

An overlapping area 18, where the contact layers 21 of adjacent pillar-shaped regions 20 merge on the side 5A of the gate electrode layer 5 facing the first main electrode 3, may comprise defects in the semiconductor material which are detectable, for example, by TEM ("Transmission Electron Microscopy").

As becomes evident from FIG. 3F, the contact layer 21 comprises a first portion 21A extending to the side 5A of the gate electrode layer 5 facing the first main electrode 3 and a second portion 21B arranged in a cavity 16 of the first insulating layer portion 6A, which may be tube-shaped. If the contact layer 21 does not extend laterally beyond the cavity 16, a contact area of the contact layer 21 is defined by a lateral extension w of the cavity 16, which is below 2 μm, exemplarily below 1 μm. However, by extending the contact layer 21 laterally to the side 5A of the gate electrode layer 5 facing the first main electrode 3, the contact area 21C is defined by the lateral dimension w of the second portion 21B, which may result in an increase of the contact area 21C by a factor of at least 2 and thus in a reduction of the source resistance $R_S$. The contact area 21C may amount to 10 mm$^2$ to 20 mm$^2$. The layer thickness d of the first portion 21A of the contact layer 21 may amount to several hundred nanometers, for example 100 nm to 500 nm.

The first insulating layer portions 6A respectively extend directly on lateral surfaces 20A of the plurality of pillar-shaped regions 20. The plurality of first insulating layer portions 6A laterally cover and laterally surround the drain layer 23, the channel layer 22 and the first portion 21A of the contact layer 21. The gate electrode layer 5 is a continuous layer laterally surrounding each pillar-shaped region 20.

A second insulating layer 19 is sandwiched in the vertical direction V between the second main electrode 4 and the gate electrode layer 5. The second insulating layer 19 separates the gate electrode layer 5 from the second main electrode 4 to minimize a parasitic capacitance of the gate electrode layer 5. The second insulating layer 19 may be of any electrically insulating material. For example, it may be a spin-on-glass (SOG) layer.

In the first exemplary embodiment each transistor cell 24 comprises one of the plurality of pillar-shaped regions 20, one of the plurality of first insulating layer portions 6A and a portion of the gate electrode layer 5 as described above to form a vertical gate-all-around field effect transistor cell.

As shown in FIGS. 3B and 3F, the power semiconductor device 1 comprises an intermediate insulating layer 25 arranged on the gate electrode layer 5, and the first main electrode 3 is arranged on the intermediate insulating layer 25. The first main electrode 3 is separated from the gate electrode layer 5 by the intermediate insulating layer 25 to be electrically insulated therefrom.

Referring to FIG. 3E, an upper portion of the first main electrode 3 is a source contact pad 3A and is serving as a source terminal of the power semiconductor device 1. Alternatively, the source contact pad 3A may be implemented as a separate element electrically connected to the first main electrode 3. The gate electrode layer 5 extending below the first main electrode 3 is electrically connected to a control contact pad 5B serving as a gate terminal of the power semiconductor device 1. In the first exemplary embodiment, the control contact pad 5B is arranged lateral to the source contact pad 3A. This means that while the contact layers 21 are connected to the source contact pad 3A from the top, the gate electrode layer 5 is connected to the control contact pad 5B from a lateral side of the power semiconductor device 1, i.e. in an orthogonal projection onto the device plane D, the source contact pad 3A overlaps the plurality of transistor cells 24 while the control contact pad 5B is arranged lateral to the plurality of transistor cells 24.

The power semiconductor device 1 according to the first exemplary embodiment is free of a carrier.

A second exemplary embodiment of a power semiconductor device 1 is shown in FIGS. 4A to 4D, wherein FIG. 4B is a cross-sectional view taken along plane A-A' shown in FIG. 4C. The second exemplary embodiment is similar to the first exemplary embodiment described in connection with FIGS. 3A to 3F. Therefore, the above explanations also apply to the second exemplary embodiment. There is a difference in that the power semiconductor device 1 according to the second exemplary embodiment comprises a first substrate layer 9 between the pillar-shaped regions 20 and the second main electrode 4. The first substrate layer 9 may be formed of the same material as semiconductor layer 13. The first substrate layer 9 may serve to grow the semiconductor layer stack 2 in the production process. The first substrate layer 9 may serve as a drift layer of the power semiconductor device 1.

FIG. 5 shows a cross-sectional view of a third exemplary embodiment of a power semiconductor device 1. The second exemplary embodiment has similarities to the first exemplary embodiment described in connection with FIGS. 3A to 3F. Therefore, the above explanations also apply to the third exemplary embodiment.

There is a difference in that the pillar-shaped regions 20 of the power semiconductor device 1 according to the third exemplary embodiment each comprise a channel layer 22 having a second conductivity type which is the same as the first conductivity type, for example n-type. So, the pillar-shaped regions 20 and the semiconductor layer stack 2 are of only one conductivity type. For example, the semiconductor layer stack 2 consists of n-doped 3C SiC. The power semiconductor device 1 is designed as an ACCUFET device.

The contact layer 21 is highly n-doped with a first doping concentration of, for example, $10^{19}$ to $10^{20}$ cm$^{-3}$. Compared with that, the channel layer 22 is weakly doped with a lower second doping concentration of, for example, $10^{16}$ to $10^{17}$ cm$^{-3}$.

FIGS. 6A and 6B show different schematic views of transistor cells 24 of a forth exemplary embodiment of a power semiconductor device, wherein FIG. 6A is a cross-sectional view taken along plane A-A' shown in FIG. 6B.

The power semiconductor device comprises a first main electrode 3, a second main electrode 4 and a semiconductor layer stack 2 between and in electrical contact with the first main electrode 3 and the second main electrode 4. The first main electrode 3 comprises a first portion 3B arranged in parallel to the second main electrode and a second portion 3C arranged obliquely, for example perpendicularly, to the first portion 3B. When producing the power semiconductor device, an insulating material layer 17 used to form the first insulating layer 6 may be formed with first portions 17A and second portions 17B (see FIG. 8B). The first portions 17A may be removed, and the second portions 3C of the first main electrode 3 may be produced at vacancies of the removed first portions 17A (see FIG. 8E).

The power semiconductor device further comprises a gate electrode layer 5, which is sandwiched in the vertical direction V between the first portion 3B of the first main electrode 3 and the second main electrode 4.

And the power semiconductor device comprises a first insulating layer 6 consisting of a plurality of second insulating layer portions 6B arranged on a side of the gate electrode layer 5 facing the second main electrode 4. The second insulating layer portions 6B have a planar configuration.

The power semiconductor device is a planar MOSFET and has the design of a vertical double diffusion metal oxide semiconductor structure (VDMOS).

The semiconductor layer stack 2 comprises differently doped semiconductor layers 15A, 15B, 14A, 14B, 13, wherein layers 15A, 15B and 13 are of the same first conductivity type, for example n-type, and wherein the doping concentration of layer 15A is higher than the doping concentration of layer 15B. Moreover, layers 14A and 14B are of the same second conductivity type, for example p-type, wherein the doping concentration of layer 14A is lower than the doping concentration of layer 14B. Layers 14B and 15B are arranged next to each other in a plane parallel to the device plane D. For example, semiconductor layer 15A is an $n^{++}$-SiC layer, semiconductor layer 15B is an $n^{+}$-sic layer, semiconductor layer 14B is a $p^{+}$-SiC layer, semiconductor layer 14A is a p-SiC layer and semiconductor layer 13 is an n-SiC layer.

The power semiconductor device comprises a plurality of fin-shaped regions 20, which traverse the gate electrode layer 5 and which each comprise a contact layer 21 arranged at the first main electrode 3, wherein each contact layer 21 extends to a side 5A of the gate electrode layer 5 facing the first main electrode 3. The fin-shaped regions 20 may consist of the contact layers 21. Each contact layer 21 is a part of the semiconductor layer 15A and thus has the same qualities as described in connection with the semiconductor layer 15A. Each contact layer 21 is arranged on a part of semiconductor layer 15B, said part forming a source layer with the contact layer 21.

Moreover, a channel layer 22 is assigned to one fin-shaped region 20 and is arranged at a side of the contact layer 21 facing away from the first main electrode 3, wherein the channel layer 22 comprises a part of semiconductor layer 14A and a part of semiconductor layer 14B, and wherein the part of semiconductor layer 14B is arranged between the second portion 3C of the first main electrode 3 and the part of semiconductor layer 14A. Two adjacent channel layers 22 are laterally separated by a ridge region 13A of semiconductor layer 13, which forms a common drain layer for all transistor cells 24. The channel layers 22 are arranged in a plane different from a plane of the gate electrode layer 5. And the drain layer 13 is arranged on a side of the channel layers 22 facing away from the contact layers 21. Exemplarily, the drain layer comprises 4H—SiC or 6H—SiC. The first insulating layer 6 is arranged between the gate electrode layer 5 and the channel layers 22 such that the gate electrode layer 5 is electrically separated from each one of the channel layers 22.

In connection with FIGS. 7A to 7F, a method for manufacturing a power semiconductor device 1 according to any one of the first to third exemplary embodiments is described.

The method comprises providing a substrate 8 comprising a first substrate layer 9 and a second substrate layer 10. The first substrate layer 9 may be deposited onto the second substrate layer 10 by a chemical vapour deposition (CVD) process, for example. Alternatively, the two-layered structure of the substrate 8 may be formed by implantation of an n-type dopant into an n-type preliminary substrate to form the first substrate layer 9 and the second substrate layer 10 having different doping concentrations. For example, the second substrate layer 10 may be a 4H—SiC $n^+$-layer and the first substrate layer 10 may be a 4H—SiC n-layer.

The method further comprises forming a sacrificial layer 11 on a first main side 8A of the substrate 8 and structuring it to form a plurality of sacrificial structures 12 protruding from the first main side 8A and having a shape of a pillar or a fin (see FIG. 7B). The sacrificial layer 11 may be a poly-silicon (poly-Si) layer or an amorphous silicon layer. Exemplarily each sacrificial structure 12 has a vertical extension h in the vertical direction V perpendicular to the first main side 8A in a range between 50 nm and 10 μm, exemplarily in a range between 5 μm and 10 μm (see FIG. 7B).

Figure 7C:
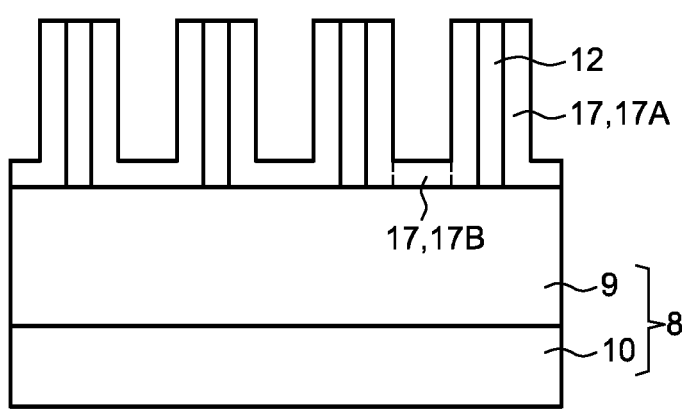

The method further comprises forming an insulating material layer 17 on the plurality of sacrificial structures 12 and on the first main side 8A comprising first portions 17A to form the first insulating layer portions 6A in the power semiconductor device and comprising second portions 17B to form the second insulating layer portions 6B in the power semiconductor device (see FIG. 7C). The insulating material layer 17 may be a thermal oxide layer formed by thermal oxidation of the sacrificial structures 12 and of exposed portions of the first substrate layer 9. Alternatively, the insulating material layer 17 can be formed by a deposition process such as by plasma enhanced CVD (PE-CVD) or another appropriate deposition process. Exemplarily, the insulating material layer 17 is a silicon oxide or a silicon nitride layer.

Figure 7D:
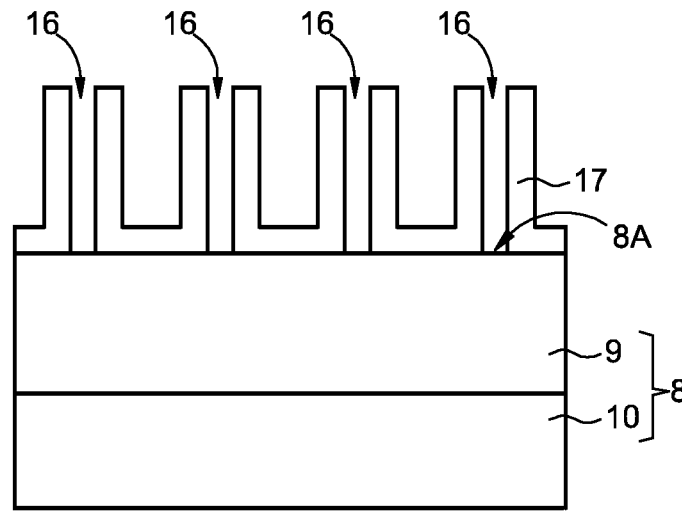
Figure 7E:
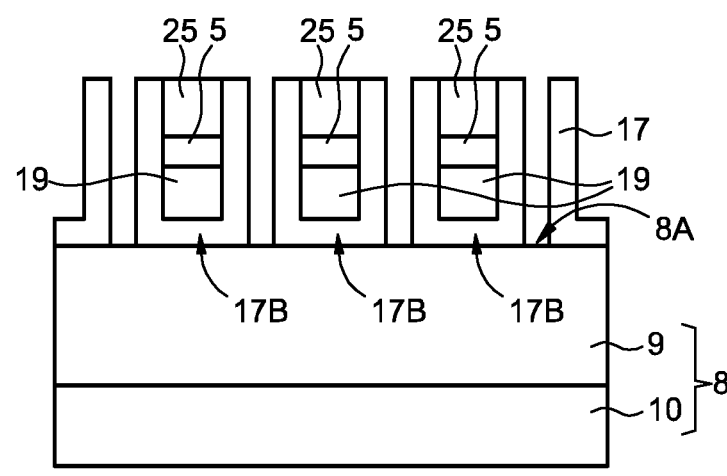

The method further comprises removing the sacrificial structures 12 to form a plurality of cavities 16 in the insulating material layer 17 (see FIG. 7D). The sacrificial structures 12 may be removed by selective etching.

The method further comprises forming the gate electrode layer 5 on a second portion 17B of the insulating material layer 17 which forms the second insulating layer portion 6B of the insulating layer 6 in the power semiconductor device. Before forming the gate electrode layer 5, a second insulating layer 19 may be formed on that part of the insulating material layer 17 which forms the at least one second insulating layer portion 6B of the insulating layer 6. Moreover, an intermediate insulating layer 25 may be formed on a side of the gate electrode layer 5 facing away from the substrate 8 (see FIG. 7E).

Figure 7F:
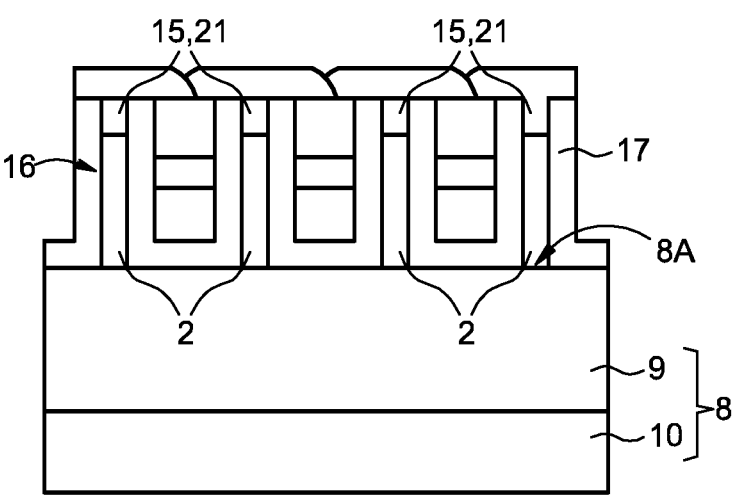

Moreover, a semiconductor layer stack 2 is formed comprising forming a semiconductor layer of the first conductivity type selectively on the first main side 8A to form a contact layer 21 in each cavity 16 such that it extends to a side of the gate electrode layer 5 facing away from the substrate 8 (see FIG. 7F). In the "gate-first" integration, forming the semiconductor layer stack 2 is performed after forming the gate electrode layer 5.

Forming the semiconductor layer stack 2 further comprises forming a semiconductor layer 14 of the second conductivity type selectively on the first main side 8A in each cavity 16 between the contact layers 21 and the substrate 8 to form the channel layers 22.

Forming the semiconductor layer stack 2 to manufacture a semiconductor power device according to the first and second exemplary embodiments further comprises forming a semiconductor layer 13 of the first conductivity type selectively on the first main side 8A in each cavity 16 between the channel layers 22 and the substrate 8 to form drain layers 23.

Moreover, the first main electrode 3 may be formed on a side of the semiconductor layer stack 2 facing away from the substrate 8. And the second main electrode 4 may be formed on a side of the semiconductor layer stack 2 facing away from the first main electrode 3 (not shown). Before forming the second main electrode 4, the substrate 8 and the at least one second portion 17B of the insulating material layer 17 as well as the part of the semiconductor layer stack 2 being laterally surrounded by the second portion 17B may be removed.

In connection with FIGS. 8A to 8E, a second exemplary embodiment of a method for producing a power semiconductor device 1 is described, said method being suitable for producing the power semiconductor device according to the forth exemplary embodiment.

Figure 8A:
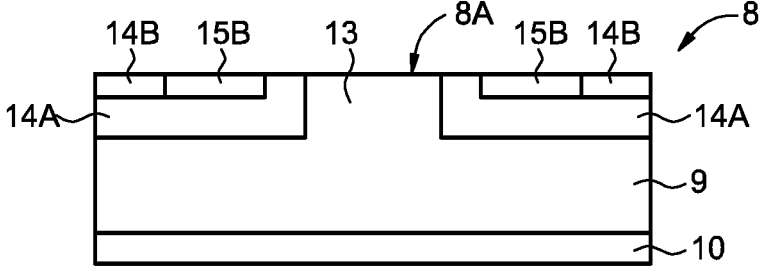
Figure 8B:
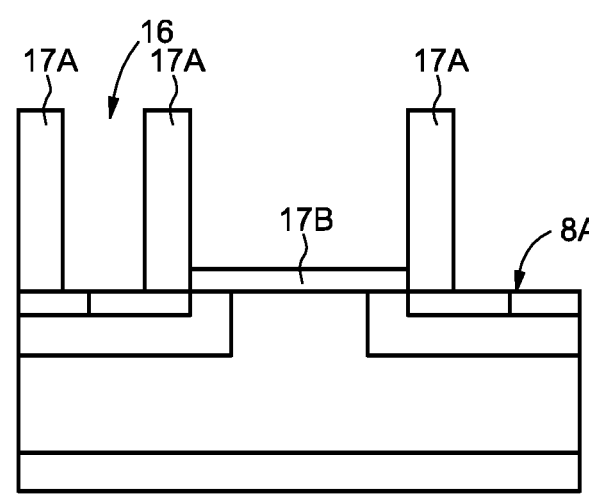
Figure 8C:
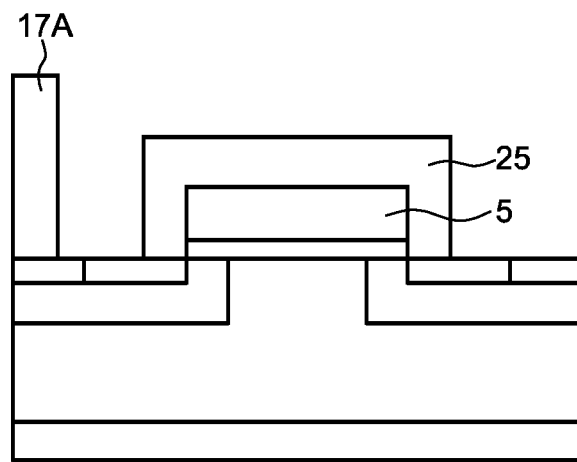

As shown in FIG. 8A, the method comprises providing a substrate 8, wherein the substrate 8 comprises a first substrate layer 9 and a second substrate layer 10. Here, the first substrate layer 9 comprises semiconductor layers 15B, 14A, 14B, 13 of the semiconductor layer stack 2.

The method further comprises forming a sacrificial layer on a first main side 8A of the substrate 8 and structuring the sacrificial layer to form a plurality of sacrificial structures (as shown in FIG. 7B, for example) protruding from the first main side 8A and having the shape of a fin. Moreover, an insulating material layer (as shown in FIG. 7C, for example) is formed on the plurality of sacrificial structures and on the first main side 8A, wherein at least a part of the insulating material layer forms the first insulating layer in the power semiconductor device 1. And each sacrificial structure is removed to form a plurality of cavities 16 in the insulating material layer (see FIG. 8B).

Figure 8D:
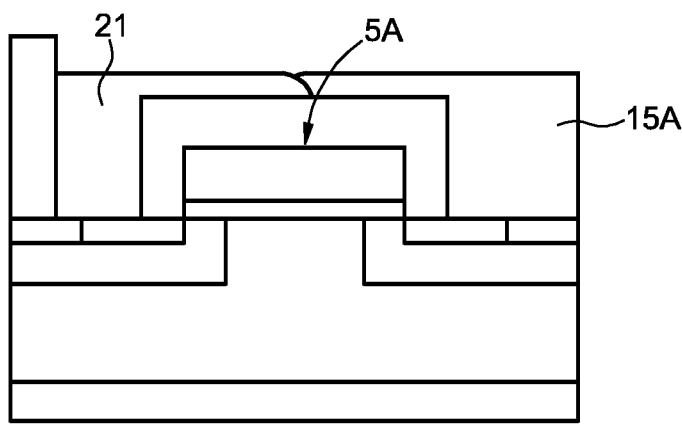
Figure 8E:
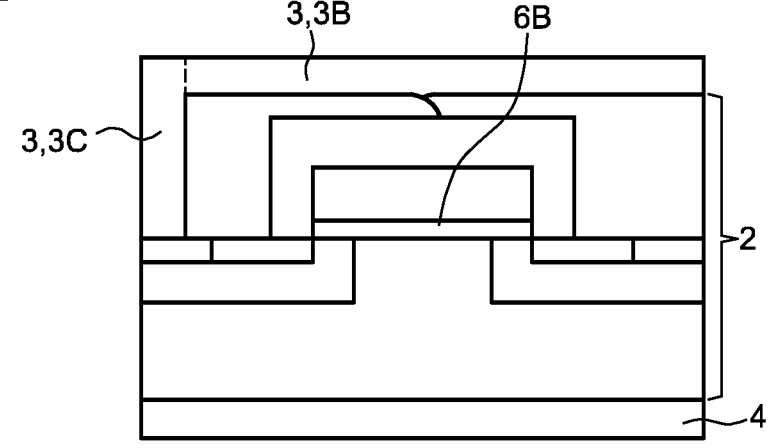
Figure 15:
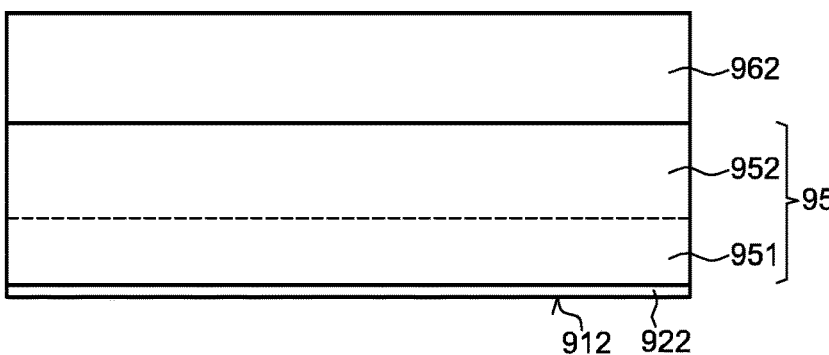

The method further comprises forming the gate electrode layer 5 on second portions 17B of the insulating material layer 17 which form the second insulating layer portions 6B of the insulating layer 6 in the power semiconductor device (see FIG. 8E). An intermediate insulating layer 25 is formed over the gate electrode layer 5 covering its side facing away from the substrate 8 as well as lateral surfaces of the gate electrode layer 5. Before forming the intermediate insulating layer 25, the first portions 17A of the insulating material layer 17 adjacent to the second portions 17B of the insulating material layer 17 may be removed.

The method further comprises selectively forming a semiconductor layer 15A of the first conductivity type on the first main side 8A to form a contact layer 21 in each cavity 16 such that it extends to a side 5A of the gate electrode layer 5 facing away from the substrate 8 (see FIG. 8D).

The method further comprises forming first portions 3B of the first main electrode 3 on a side of the semiconductor layer stack 2 facing away from the substrate 8 (see FIG. 8E). And second portions 3C of the first main electrode 3 are formed at vacancies, where first portions 17A of the insulating material layer 17 adjacent to the contact layers 21 have been removed.

The method further comprises forming the second main electrode 4 on a side of the semiconductor layer stack 2 facing away from the first main electrode 3 (see FIG. 8E). Before forming the second main electrode 4, the second substrate layer 10 may be removed.

In FIGS. 9 and 10, another exemplary embodiment of the power semiconductor device 1 is illustrated. The power semiconductor device 1 comprise a first main electrode 921 at a first main side 911 and a second main electrode 922 at a second main side 912. The first and the second main electrodes 921, 922 are, for example, metallic electrodes.

Between the first and the second main electrodes 921, 922 there is a semiconductor layer stack 93 consisting of a plurality of pillars 930. Thus, the pillars 930 run from the first main electrode 921 to the second main electrodes 922. Moreover, between the first and the second main electrodes 921, 922 there is a gate electrode layer 94 embedded between a top gate insulator layer 942 and a bottom gate insulator layer 943. At side walls of the pillars 930, there are gate insulator walls 941. It is noted that in FIG. 10 two pillars 930 are illustrated with a part of the gate electrode layer 94 in between. For example, the gate electrode layer 94 is of highly doped silicon.

The gate electrode layer 94 defines a common plane P which is perpendicular to a direction of main extent of the pillars 930 and, thus, perpendicular to a growth direction of the pillars 930. The common plane P may run in parallel with the first and the second main electrodes 921, 922 and may be located in a center of the gate electrode layer 94. By means of the gate insulators 941, 942, 943, gate electrode layer 94 is electrically insulated from the first and the second main electrodes 921, 922 as well as from the semiconductor layer stack 93. There can be a gate electrode line, not shown, that provides external electric contact to the gate electrode layer 94.

The pillars 930 and, thus, the semiconductor layer stack 93 is of only one conductivity type. For example, the semiconductor layer stack 93 consists of n-type doped 3C SiC. Hence, the power semiconductor device 1 may be a so-called AccuFET device.

The pillars 930 each comprise a top region 931 at the first main electrode 921 and a channel region 932 between the top region 931 and the second main electrode 922. The top region 931 is n$^+$-doped with a first doping concentration of, for example, $3 \times 10^{19}$ cm$^{-3}$. Compared with that, the channel region 932 is weakly doped with a lower second doping concentration of, for example, $5 \times 10^{16}$ cm$^{-3}$.

In a direction perpendicular to the common plane P, the top region 931 can terminate flush with the top gate insulator layer 942. For example, a thickness of the top region 931 and/or the top gate insulator layer 942 and/or the bottom gate insulator layer 943 is at least 0.1 μm and/or at most 1 μm, for example, 0.3 μm. A thickness of the channel region 932 exceeds the thickness of the top region 931 in the direction perpendicular to the common plane P by at least a facto of two and/or by at most a factor of 20, for example.

However, contrary to what is illustrated in FIGS. 9 and 10, as an option the pillars 930 may merge atop and/or below the gate electrode layer 94 analogous to the contact layer 21 of, for example, FIG. 3B. Hence, otherwise to what has been mentioned for FIGS. 9 and 10, the same as to FIGS. 1 to 8 may also apply for FIGS. 9 and 10. Although different reference numerals may be used in FIGS. 9 and 10 compared with FIGS. 1 to 8, the respective corresponding components can be regarded as equivalents. The same applies for FIGS. 11 to 32 below.

In the exemplary embodiment of FIG. 11, the semiconductor layer stack 93 further comprises a base layer 95. To simplify the drawing, there is only one base layer 95 in FIG. 11. However, there can also be a plurality of such layers. The at least one base layer 95 is a continuous layer at which all the pillars 930 start. The base layer 95 can be in direct contact with the second main electrode 922. The base layer 95 is of the same conductivity type as the pillars 930 so that the whole semiconductor layer stack 93 is either n-doped or p-doped.

For example, the base layer 95 comprises a SiC substrate of 4H SiC, and can include an epitaxially grown drift region and/or at least one buffer layer, not shown. A thickness of the base layer 95 is, for example, at least 0.01 μm and/or at most 10 μm in case of a solely epitaxially grown layer, or at least 5 μm and/or at most 0.5 mm in case of a growth substrate. The common plane P may be in parallel with a side of the base layer 95 facing the first main electrode 921.

Otherwise, the same as to FIGS. 9 and 10 may also apply for FIG. 11.

According to FIG. 12, the pillars 930 each comprise a bottom region 933 at a side of the channel region 932 remote from the top region 931. The bottom region 933 is, for example, of n-type doped 3C SiC. For example, a third doping concentration of the bottom region 933 is the same as the first doping concentration of the top region 931. The bottom region 933 may be in direct contact with the base layer 95 or, if there is no such base layer like in FIGS. 9 and 10, in direct contact with the second main electrode 922.

In the direction perpendicular to the common plane P, the bottom region 933 may terminate flush with the bottom gate insulator layer 943. For example, a thickness of the bottom region 933 is at least 0.1 μm and/or at most 1 μm, for example, 0.3 μm. The thickness of the channel region 932 exceeds the thickness of the bottom region 931 in the direction perpendicular to the common plane P by at least a facto of two and/or by at most a factor of 920, for example.

Otherwise, the same as to FIGS. 9 to 11 may also apply for FIG. 12.

According to FIG. 13, the pillars 930 become narrower along a direction away from the second main electrode 922 and, thus, towards the first main electrode 921. The pillars 930 may have the shape of truncated cones. An opening angle of the truncated cone is, for example, 30°. Such cone-shaped pillars 930 can also be used in the exemplary embodiments of FIGS. 9 and 10 as well as of FIG. 12.

Otherwise, the same as to FIGS. 9 to 12 may also apply for FIG. 13.

Also in the exemplary embodiment of FIG. 14 the pillars 930 converge in the direction towards the first main electrode 921. Contrary to FIG. 13, the gate insulator walls 941 and the bottom gate insulator layer 943 are made of one piece. Moreover, the cone-shaped pillars 930 may have an opening angle of just 15° or less, for example.

A width w of the pillars 930, measured at the side of the pillars 930 facing the second main electrode 922, is, for example, at least 0.3 μm and/or at most 1 μm. A height h of the pillars 930 in the direction perpendicular to the common plane P is, for example, at least 2 μm and/or at most 10 μm. A pitch of the pillars 930, that is, a distance between adjacent center lines of the pillars 930 measured in parallel with the common plane P is, for example, at least 2 μm and/or at most 10 μm. A density of the pillars 930 on the second main electrode 922 is, for example, at least $2 \times 10^6$ cm$^{-2}$ and/or at most $5 \times 10^7$ cm$^{-2}$. These values may individually or collectively apply to all other exemplary embodiments, too.

Otherwise, the same as to FIGS. 9 to 13 may also apply for FIG. 14.

In FIGS. 15 to 21, a method for producing the power semiconductor device is illustrated. According to FIG. 15, the base layer 95 is provided. The base layer 95 can include a comparably thick semiconductor substrate 951 of, for example, 4H SiC of $n^+$-doping type.

As an option, on top of the semiconductor substrate 951 there is a drift region 952 of, for example, 4H SiC of $n^-$-doping type. The drift region 952 has, for example, a doping concentration of at least $1 \times 10^{15}$ cm$^{-3}$ and/or of at most $3 \times 10^{16}$ cm$^{-3}$, for example, $4 \times 10^{15}$ cm$^{-3}$.

A thickness of the semiconductor substrate 951 is, for example, at least 0.1 mm and/or at most 1 mm. A thickness of the optional drift region 952 may be at least 0.1 μm and/or at most 1 μm. The same can apply to all other exemplary embodiments.

Moreover, on the base layer 95 there is a starting layer 962 for a later semiconductor mask 963. For example, the starting layer 962 is of amorphous silicon.

Figure 16:
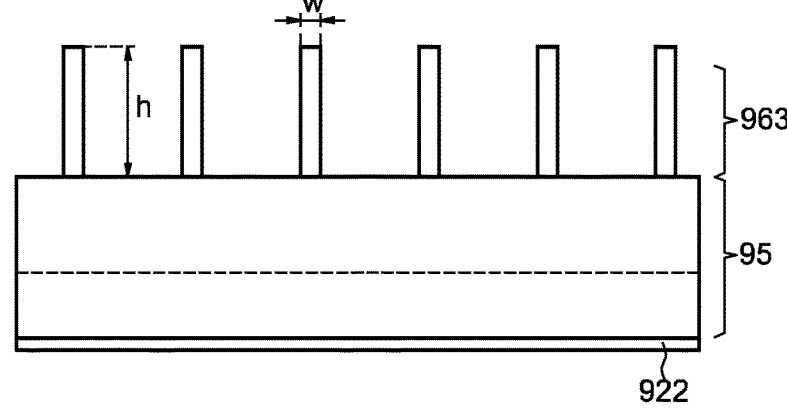

In the method step of FIG. 16, the starting layer 962 is structured to become the semiconductor mask 963 by means of etching. The semiconductor mask 963 is a positive of the later pillars 930 and individual columns of the semiconductor mask 963 may have a height h of 2 μm to 5 μm and a width w of 0.3 μm to 1 μm.

Figure 17:
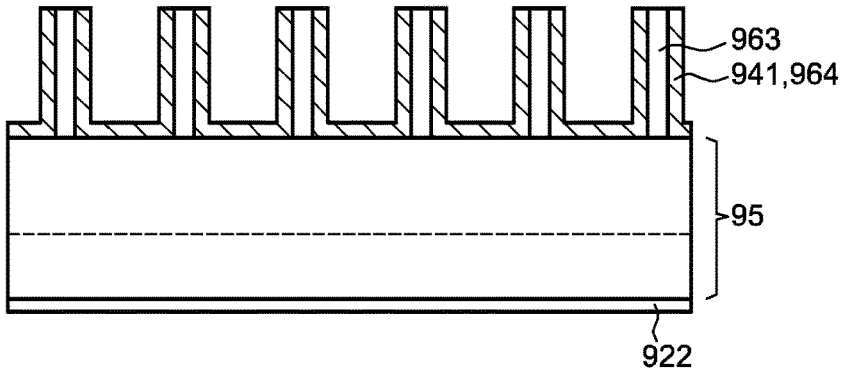

According to FIG. 17, the columns of the semiconductor mask 963 are oxidized to create tubes 964 for the later gate insulator walls 941. The tubes 964 are, thus, for example, of thermal SiO$_2$. Moreover, tops of these columns of the semiconductor mask 963 are etched down using, for example, reactive ion etching to expose tops of the columns. A wall thickness of the tubes 964 is, for example, between 5 nm and 0.2 μm inclusive.

Figure 18:
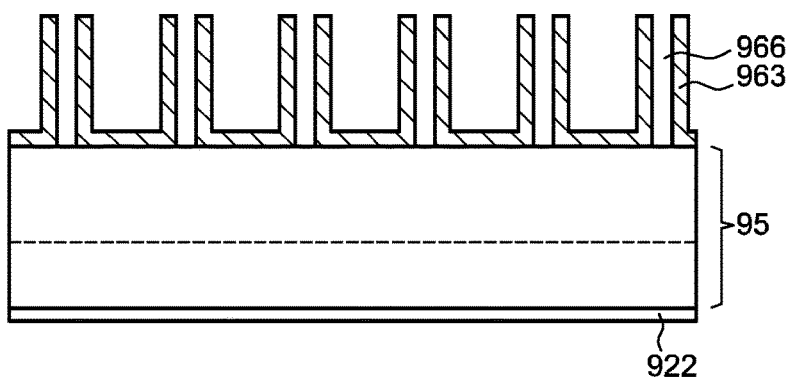

Next, see FIG. 18, the amorphous Si columns of the semiconductor mask 963 are completely etched away using, for example, tetramethylammonium hydroxide, TMAH for short, and the hollow tubes 964 of SiO$_2$ remain on a surface of the base layer 95. The tubes 964 thus surround cavities 66.

Figure 19:
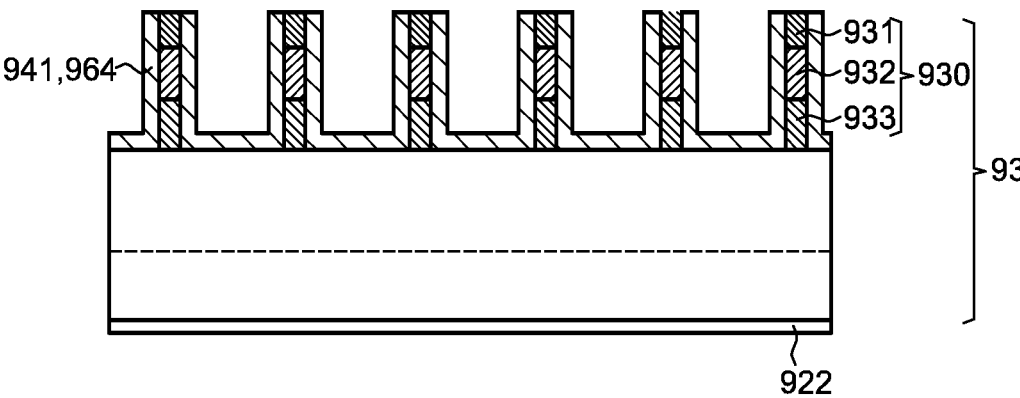

In the step according to FIG. 19 the pillars 930 are grown in the tubes 964 starting on the base layer 95. Because the semiconductor material for the pillars 930 does not grow on the material used for the tubes 964, a shape of the pillars 930 is well-defined and an interface between the tubes 964 and the pillars 930 is of high quality. That is, growth is prevented on all areas and surfaces on the base layer 95 that are covered with SiO$_2$. Only inside the hollow tubes 964 the 3C SiC pillars 930 are grown, which can be in-situ doped as required.

Then, see FIG. 20, optionally a planarization is performed using, for example, spin-on-glass, SOG for short. Hence, the bottom gate insulator layer 943 can be created.

Subsequently, see FIG. 21, a self-aligned gate process enables a gate-all-around device design so that the gate electrode layer 94 is produced. As also possible in all other exemplary embodiments, the gate electrode layer 94 may be divided into two parts between adjacent pillars 930 contrary to what is illustrated in FIGS. 9 to 13.

The final steps of producing the top gate insulator layer and the first main electrode are not shown in the method of FIGS. 15 to 21.

Otherwise, the same as to FIGS. 9 to 14 may also apply for FIGS. 15 to 21.

In FIGS. 22 to 24, another method for producing power semiconductor devices 1, 1\* is illustrated. The produced power semiconductor devices 1, 1\* can be AccuFETs as illustrated in FIGS. 9 to 14, for example, but can also be IGBTs or diodes or vertical FETs. For example, the structure produced with the method of FIGS. 22 to 24 is a superjunction structure accommodated in the base layer 95 of the power semiconductor devices 1 of, for example, FIGS. 11 to 14.

According to FIG. 23, the semiconductor substrate 951 is provided which may be of $n^+$-doped SiC. Moreover, a semiconductor mask 963 of, for example, silicon is applied to the semiconductor substrate 951.

In a first variant, the semiconductor mask 963 can be a positive of the pillars produced later and can consequently be composed of a plurality of columns. Otherwise, in a second variant, the semiconductor mask 963 can be a negative of the later pillars and, thus, can be a continuous layer comprising holes for the later pillars. In FIGS. 22 to 24 as well as in FIGS. 25 to 27, the first variant is illustrated, but of course the same applies analogously to the second variant although not explicitly fully described.

Hence, following the first variant, see also FIG. 22 the columns of the semiconductor mask 963 are oxidized so that the tubes 964 result. If, for example, a superjunction is produced then the wall thickness of the tubes 964 is, for example, between 1 nm and 10 nm inclusive. Otherwise, if a gate insulator wall 941 is produced then the wall thickness can be greater and can be, for example, between 5 nm and 0.2 μm inclusive.

Subsequently, see FIG. 23, a filling material 965 is grown between the still present columns of the semiconductor mask 963. The filling material 965 is, for example, $n^+$-doped SiC or $n^-$-doped SiC. Thus, according to the first variant the filling material 965 is a continuous layer enclosing the columns of the semiconductor mask 963. Otherwise, in the second variant, the filling material 965 would be shaped as a plurality of columns. However, in both variants there are tubes 964, and the only difference is that the filling material 965 is located either outside or inside the tubes 964.

Of course, if not pillars, but fins are produced, then the tubes 964 can be form boards so that plane-parallel walls are formed instead of the cylindrical walls of the tubes 964. The same applies for all other exemplary embodiments of the method and of the power semiconductor device 1, 1\*.

As an option, a cap layer 967 may be grown on top of the filling material 965. A thickness of the cap layer 967 is, for example, at most 10% of a thickness of the filling material 965. The cap layer 967 is, for example, $n^-$-doped SiC.

Then, see also FIG. 23, in the first variant the columns of the semiconductor mask 963 are removed so that the cylindrical cavities 966 result. However, the tubes 964 remain intact. In the second variant, not shown, accordingly there are no cylindrical cavities but an empty space around the then pillar shaped filling material 965.

As an option, the cap layer 967 may also be provided with an oxide layer which can be like the tubes 964.

Afterwards, see FIG. 24, according to the first variant the cavities 966 are filled with a further semiconductor material 968 that can constitute, for example, the pillars 930 as explained in FIGS. 9 to 14. For example, the further semiconductor material 968 is $p^+$-doped SiC in case of a superjunction structure 97. Otherwise, for a AccuFET, for example, the further semiconductor material 968 is $n^-$-doped SiC for the channel regions and $n^+$-doped SiC for the top regions. According to the second variant, the further semiconductor material 968 would be a continuous layer formed around the pillar-shaped filling material 965, but in each case there is the insulator material of the tubes 964 between the filling material 965 and the further semiconductor material 968.

In subsequent optional steps, not shown, it is possible to provide, if required, a planarization layer and to perform the method steps of FIGS. 15 to 21 atop the planarization layer to further create an AccuFET structure atop the superjunction structure 97 that could be formed by the method steps of FIGS. 22 to 24.

The same concept illustrated in FIGS. 22 to 24 works using an oxide or nitride mask, not shown, instead of the semiconductor mask 963. Then, in this variant the filling material 965 is applied, followed by oxidation or oxide deposition, not shown. Before the growth step of the further semiconductor material as illustrated in FIG. 24, not shown, in this variant an anisotropic oxide removal at a bottom of the cavities is performed so that the further semiconductor material 968 can then be applied on the substrate 951.

As an alternative to the semiconductor filling material 965, it is also possible that the gate electrode layer as well as the top and bottom gate insulator layers as illustrated in FIGS. 9 to 14 can be applied instead.

The method of FIGS. 25 to 27 is essentially the same as in FIGS. 22 to 24, but instead of the SiC semiconductor substrate 951 that can be present in the finished power semiconductor device 1, 1*, a temporal Si semiconductor substrate 961 is used, see FIG. 25.

Hence, near the Si semiconductor substrate 961 a defective buffer region 969 may result, see FIG. 26.

This defective buffer region 969 may extend to the further semiconductor material 968 grown in the cavities 966. As an option, the defective buffer region 969 can be removed together with the semiconductor substrate 961, not shown.

Otherwise, the same as to FIGS. 22 to 24 may also apply for FIGS. 25 to 27. For example, both the first variant and the second variant as explained in connection with FIGS. 22 to 24 can also be applied in the method of FIGS. 25 to 27.

In FIGS. 28 and 29, an exemplary embodiment of the power semiconductor device 1 that is an AccuFET as well as an exemplary embodiment of the power semiconductor device 1* that is a superjunction FET are illustrated. These power semiconductor devices 1, 1* may be produced using, for example, the method of FIGS. 22 to 24 or of FIGS. 25 to 27.

In the case of the power semiconductor device 1 that is an AccuFET, the base layer 95 includes the superjunction structure 97 manufactured, for example, with the method of FIGS. 22 to 24. Accordingly, the pillars 930 include the n-doped top regions 931, the n-doped channel regions 932 and as an option the n-doped bottom regions 933. Between the gate electrode layer 94 and the second main electrode layer 922, there is the further semiconductor material 968 which may be p-doped, and which is separated from the n-doped regions by means of the tubes 964. The semiconductor substrate 951 is also n-doped.

In the case of the power semiconductor device 1* that is a superjunction MOSFET or superjunction MISFET, then there are the n-doped top regions 931, the p-doped channel regions 932* and the n-doped bottom regions 933 in the pillars 930 and as an option the n-doped semiconductor substrate 51 in the base layer 95.

As can be seen in FIG. 29, the pillars 930 can be arranged in a hexagonal pattern and can have a square footprint. Otherwise, square or rectangular patterns can also be used. Moreover, circular or elliptic or polygonal footprints are also possible for the pillars 930. The same applies to all other exemplary embodiments.

Otherwise, the same as to FIGS. 9 to 27 may also apply for FIGS. 28 and 29.

In FIG. 30 another exemplary embodiment of the power semiconductor device 1* is illustrated as a top view, the cross-sectional view is the same as in FIG. 28. In this embodiment, the gate electrode layer 94 and, thus, the further p-doped semiconductor material 968 are structured as stripes that run, for example, in parallel with one another.

The filling material 965 is composed of a plurality of the pillars 930 arranged next to one another along the stripes of the gate electrode layer 94. Between adjacent pillars 930, there are in each case walls of the tubes 964 and, thus, walls of the insulator material the tubes 964 are made of. For example, a footprint of the pillars 930 is 1 μm×1 μm and a thickness of the walls of the pillars 930 is 10 nm.

Otherwise, the same as to FIGS. 28 and 29 may also apply for FIG. 30.

Another exemplary embodiment of the power semiconductor device 1* is illustrated in FIGS. 31 and 32. The power semiconductor device 1* is a superjunction Schottky diode comprising in the superjunction structure 97 the top regions 931 that may be n-doped, the filling material 965 that may also be n-doped and the further semiconductor material 968 that may be p-doped. As an option, there can be the common semiconductor substrate 951. An electrical insulator material 942 is arranged atop the further semiconductor material 968 and extends nearer towards the second main electrode 922 than the top regions 931.

Seen in top view, the further semiconductor material 968 as well as the filling material 965 can be arranged in stripes. In each case, the stripes are composed of a plurality of the respective columns 930. Between adjacent columns, there are the walls of the tubes 964. Such an arrangement concerning the further semiconductor material 968 may also be present in FIG. 29 or 30.

Otherwise, the same as to FIGS. 9 to 30 may also apply for FIGS. 31 and 32.

Hence, the design of FIGS. 28 to 32 is possible, for example, for diodes and MOSFETs. It can be applied to pillar and stripe layouts with and without oxide bridges along the stripes for further defect capturing. The dimensions can be relatively small, such that additionally to a superjunction effect also volume inversion can occur to further improve conduction of current. An advantage of this concept is, for example, that gate refilling can be fully self-aligned in the pillars and does not require advanced lithography tools to obtain a low pitch of, for example, less than 1 μm.

With the superjunction structure 97, superior current blocking with smaller leakage can be achieved. The reason for smaller leakage is the smaller electric field at the metal/semiconductor interface. For a MOSFET, for example, this effect implies that an electric field at a gate insulator during blocking will be smaller than compared to conventional trench designs, yielding to better reliability and potentially thinner gate insulators to further improve performance of the power semiconductor devices 1, 1*.

Thus, to have superjunction structures allows the usage of alternative substrate material other than SiC like Si and of low temperature epitaxy reactors, because standard Si CVD can be used, since defective growth, stress and relaxation defects will be confined in a thin defective buffer region and do not extend towards a bulk region of the superjunction structure itself. Hence, smooth and crystalline layers can be grown at growth temperatures of lower than 1250° C. suitable for selective epitaxy. Hence, high performance wide bandgap superjunction devices can be obtained with superior conduction performance at relatively low cost.

The term 'and/or' describes only an association relationship for describing associated objects and represents that three relationships may exist. For example, A and/or B may represent the following three cases: Only A exists, both A and B exist, and only B exists. Correspondingly, the wording 'at least one of A, B and C' may represent the following seven cases: Only A exists, only B exists, only C exists, both A and B exist, both A and C exist, both B and C exist, as well as all three A and B and C exist; the same applies analogously if there are only two or more than three entities in the list following 'at least one of'. Thus, 'at least one of A and B' is equivalent to 'A and/or B'.

The exemplary embodiments described in this disclosure are is not restricted by the description given with reference to the exemplary embodiments. Rather, it is contemplated that the disclosure encompasses any novel feature and any combination of features, including in particular any combination of features in the claims, even if this feature or this combination is not itself explicitly indicated in the claims or exemplary embodiments.

This patent application claims the priority of European patent applications 20216094.1 and 20216022.2, the disclosure content of which is hereby incorporated by reference.

LIST OF REFERENCE SIGNS 1, 1* semiconductor power device
2, 93 semiconductor layer stack
3, 921 first main electrode
3A source contact pad
3B first portion of first main electrode
3C second portion of first main electrode
4, 922 second main electrode
5, 94 gate electrode layer
5A side of the gate electrode layer facing the first main electrode
5B control contact pad
6 first insulating layer
6A first insulating layer portion
6B second insulating layer portion
7 carrier
8 substrate
8A first main side of the substrate
9 first substrate layer
10 second substrate layer
11 sacrificial layer
12 sacrificial structure
13, 14A, 14B, 15A, 15B semiconductor layer
13A ridge region
16 cavity
17 insulating material layer
17A first portion of insulating material layer
17B second portion of insulating material layer
18 overlapping area
19 second insulating layer
20, 930 pillar-shaped or fin-shaped region
20A lateral surface of pillar-shaped or fin-shaped region
21 contact layer
21A first portion of contact layer
21B second portion of contact layer
21C contact area
22 channel layer
23 drain layer
24 transistor cell
25 intermediate insulating layer
911 first main side
912 second main side 930 pillar
931 top region
932 channel region, same conductivity type as top region
932* channel region, other conductivity type than top region
933 bottom region
941 gate insulator wall
942 top gate insulator layer
943 bottom gate insulator layer
95 base layer of the semiconductor layer stack
951 semiconductor substrate, permanently present
952 drift region
961 semiconductor substrate, temporary present
962 starting layer for the semiconductor mask
963 semiconductor mask
964 tube of insulator material
965 filling material
966 cavity
967 cap layer
968 further semiconductor material
969 defective buffer region
97 superjunction structure
d layer thickness
w first lateral extension, width of the pillars or fins
l second lateral extension
h vertical extension, height of the pillars or fins
D device plane
L1 first lateral extension direction
L2 second lateral extension direction
P common plane
V vertical direction

The invention claimed is:

1. A semiconductor device comprising:
a first main electrode,
a second main electrode,
a gate electrode layer between the first main electrode and the second main electrode,
a single semiconductor layer stack comprising silicon carbide (SIC) between and in electrical contact with the first main electrode and the second main electrode, the single semiconductor layer stack comprising:
differently doped semiconductor layers, wherein at least two semiconductor layers differ in at least one of their conductivity type and their doping concentration,
a plurality of pillar-shaped regions, which run through the gate electrode layer and which each comprise a contact layer arranged at the first main electrode with a first doping concentration and with a first conductivity type, the plurality of pillar-shaped regions have a square or polygonal or circular or elliptic footprint, and
exactly one first insulating layer comprising a plurality of first insulating layer portions running through the gate electrode layer and at least one second insulating layer portion arranged on a side of the gate electrode layer facing the second main electrode,
wherein
each contact layer extends to the side of the gate electrode layer facing the first main electrode,
the contact layers of adjacent pillar-shaped regions merge on the side of the gate electrode layer facing the first main electrode,
the plurality of first insulating layer portions are filled in each case with the single semiconductor layer stack that directly covers inward faces of the plurality of first insulating layer portions so that the plurality of first insulating layer portions define the plurality of pillar-shaped regions, and the plurality of first insulating layer portions surround laterally completely the corresponding one of the plurality of pillar-shaped regions so that a plurality of vertical gate-all-around field effect transistor cells is formed.

2. The semiconductor device according to claim 1, wherein the gate electrode layer is a continuous layer, and wherein the footprint of the plurality of pillar-shaped regions is square or circular.

3. The semiconductor device according to claim 1, wherein at least one of the following applies:

the single semiconductor layer stack comprises a plurality of channel layers each assigned to one pillar-shaped region and arranged at sides of the contact layers facing away from the first main electrode, and the plurality of pillar-shaped regions is pillar-shaped so that a plurality of pillars is formed, each one of the pillars comprises a top region at the first main electrode with a first doping concentration, and at sides of the top regions facing away from the first main electrode, and in a common plane with the gate electrode layer, each of the pillars comprises a channel region with a second doping concentration.

4. The semiconductor device according to claim 3, wherein the plurality of channel layers have a second doping concentration and a second conductivity type, wherein at least one of the second doping concentration differs from the first doping concentration or the second conductivity type differs from the first conductivity type.

5. The semiconductor device according to claim 3, wherein the first insulating layer is arranged between the gate electrode layer and the plurality of channel layers such that the gate electrode layer is electrically separated from each one of the plurality of channel layers.

6. The semiconductor device according to claim 5, wherein the plurality of channel layers are at least partly arranged in a common plane with the gate electrode layer.

7. The semiconductor device according to claim 3, wherein the plurality of pillar-shaped regions is pillar-shaped so that a plurality of pillars is formed, and at least one of the following applies:

the plurality of pillars extend perpendicular to a common plane, the first doping concentration is between $1\times10^{16}$ cm$^{-3}$ and $2\times10^{17}$ cm$^{-3}$ inclusive, and the second doping concentration is between $5\times10^{18}$ cm$^{-3}$ and $2\times10^{20}$ cm$^{-3}$ inclusive, seen in cross-section through the common plane and in parallel with the common plane, a width of the plurality of pillars is at least 0.05 μm and at most 1 μm, seen in the cross-section through the common plane and perpendicular to the common plane a height of the plurality of pillars is at least twice the width and at most 20 times the width, and seen in top view of the common plane, a density of the plurality of pillars is between $1\times10^{6}$ cm$^{-2}$ and $4\times10^{7}$ cm$^{-2}$ inclusive.

8. The semiconductor device according to claim 1, wherein each pillar-shaped region has a first lateral extension which is below 2 μm, or below 1 μm, wherein each pillar-shaped region comprises a bottom region on a side of the respective channel region facing the second main electrode, and a third doping concentration of the bottom regions is the first doping concentration, with a tolerance of at most a factor of two.

9. The semiconductor device according to claim 1, wherein the plurality of pillar-shaped regions is pillar-shaped so that a plurality of pillars is formed and the pillars have in each case the shape of a truncated cone, an opening angle of the truncated cones is between 10 and 35 inclusive.

10. The semiconductor device according to claim 3, wherein, the plurality of pillar-shaped regions is pillar-shaped so that a plurality of pillars is formed, the single semiconductor layer stack further comprises a base layer which is a continuous layer and which is located at a side of the pillars facing away from the first main electrode in parallel with the common plane, all the plurality of pillars are in contact with the base layer, the plurality of pillars and the base layer comprise at least one of different semiconductor materials and different crystallographic structures.

11. A method for manufacturing a semiconductor device comprising:

providing a substrate, forming a sacrificial layer as the semiconductor mask on a first main side of the substrate, structuring the sacrificial layer to form a plurality of sacrificial structures protruding from the first main side and having the shape of a pillar or a fin, forming an insulating material layer on at least one of the plurality of sacrificial structures and the first main side, wherein at least a part of the insulating material layer forms the first insulating layer in the semiconductor device, removing at least one sacrificial structure to form at least one cavity in the insulating material layer, forming a gate electrode layer on a second portion or second portions of the insulating material layer which form(s) at least one second insulating layer portion in the semiconductor device, forming a first semiconductor layer of a first conductivity type selectively on the first main side to form a contact layer in the at least one cavity extending to a side of the gate electrode layer facing away from the substrate, forming a first main electrode on a side of a semiconductor layer stack facing away from the substrate, forming a second main electrode on a side of the semiconductor layer stack facing away from the first main electrode, wherein the gate electrode layer is located between the first main electrode and the second main electrode, the semiconductor layer stack is located between and in electrical contact with the first main electrode and the second main electrode, the semiconductor layer stack comprising:

the first semiconductor layer of the first conductivity type and a second semiconductor layer of a second conductivity type, wherein said first and second semiconductor layers differ in at least their conductivity type, a plurality of pillar-shaped or fin-shaped regions, which run through the gate electrode layer and which each comprise the contact layer arranged at the first main electrode with a first doping concentration and with the first conductivity type, wherein each contact layer extends to a side of the gate electrode layer facing the first main electrode, and the contact layers of adjacent pillar-shaped or fin-shaped regions merge on the side of the gate electrode layer facing the first main electrode.

12. The method according to claim 11, wherein the method comprises forming the semiconductor layer of the first conductivity type which is provided to form the contact layers after producing the gate electrode layer.

13. The method according to claim 11, wherein the method comprises:

selectively forming the second semiconductor layer of the second conductivity type on the first main side in each cavity between the contact layers and the substrate to form channel layers, and selectively forming a semiconductor layer of the first conductivity type on the first main side in each cavity between the channel layers and the substrate to form the drain layers.

\* \* \* \* \*